US012690416B2

(12) United States Patent
Takahashi

(10) Patent No.: US 12,690,416 B2
(45) Date of Patent: Jul. 21, 2026

(54) SUBSTRATE PROCESSING METHOD

(71) Applicant: SCREEN Holdings Co., Ltd., Kyoto (JP)

(72) Inventor: Tomohiro Takahashi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 444 days.

(21) Appl. No.: 18/560,099

(22) PCT Filed: May 16, 2022

(86) PCT No.: PCT/JP2022/020422
§ 371 (c)(1),
(2) Date: Nov. 10, 2023

(87) PCT Pub. No.: WO2022/244745
PCT Pub. Date: Nov. 24, 2022

(65) Prior Publication Data
US 2024/0234189 A1     Jul. 11, 2024

(30) Foreign Application Priority Data
May 20, 2021     (JP) ................................. 2021-085328

(51) Int. Cl.
H10P 72/30          (2026.01)
H10P 50/64          (2026.01)
H10P 72/00          (2026.01)
(52) U.S. Cl.
CPC ........ H10P 72/3412 (2026.01); H10P 50/642 (2026.01); H10P 72/0408 (2026.01); H10P 72/32 (2026.01); *H10P 72/0406* (2026.01)
(58) Field of Classification Search
None
See application file for complete search history.

(56) References Cited

U.S. PATENT DOCUMENTS

2002/0036002 A1     3/2002     Nakatou
2003/0032292 A1     2/2003     Noguchi
(Continued)

FOREIGN PATENT DOCUMENTS

JP          H05-166791 A          7/1993
JP          2002-118086 A         4/2002
(Continued)

OTHER PUBLICATIONS

International Search Report mailed Jul. 26, 2022 in corresponding PCT International Application No. PCT/JP2022/020422.
(Continued)

*Primary Examiner* — Kaj K Olsen
*Assistant Examiner* — Richard Z. Zhang
(74) *Attorney, Agent, or Firm* — OSTROLENK FABER LLP

(57) ABSTRACT

In substrate processing using the batch processing unit and the single substrate processing unit, the entire substrate processing is efficiently advanced. A substrate processing method includes: a process of calculating a required period of time that is a period of time taken for the substrates to complete the substrate processing in the single substrate processing unit according to a standby number that is a number of the substrates after being subjected to chemical liquid processing in the batch processing unit and before being subjected to drying processing in single substrate processing unit; and a process of controlling a start timing of the chemical liquid processing in the batch processing unit to make the required period of time shorter than a period of time taken for the chemical liquid processing in the batch processing unit.

17 Claims, 11 Drawing Sheets

(56) References Cited

U.S. PATENT DOCUMENTS

| 2006/0027323 | A1 |  | 2/2006 | Miya et al. |
|---|---|---|---|---|
| 2006/0137726 | A1 |  | 6/2006 | Sano et al. |
| 2008/0230101 | A1 |  | 9/2008 | Hayashi |
| 2015/0332940 | A1 |  | 11/2015 | Wang et al. |
| 2017/0069485 | A1 | * | 3/2017 | Jeong ...................... H10P 70/20 |
| 2019/0237350 | A1 |  | 8/2019 | Mitsuya |
| 2020/0203193 | A1 | * | 6/2020 | Nam ........................ H10P 70/20 |
| 2021/0111038 | A1 |  | 4/2021 | Kanagawa et al. |
| 2021/0111054 | A1 |  | 4/2021 | Kanagawa et al. |

FOREIGN PATENT DOCUMENTS

| JP | 2003-051481 | A | 2/2003 |
|---|---|---|---|
| JP | 2006-147779 | A | 6/2006 |
| JP | 2008-235813 | A | 10/2008 |
| JP | 4467379 | B2 | 5/2010 |
| JP | 2016-502275 | A | 1/2016 |
| JP | 2019-133998 | A | 8/2019 |
| JP | 2020-088194 | A | 6/2020 |
| JP | 2021-064652 | A | 4/2021 |
| JP | 2021-064654 | A | 4/2021 |
| KR | 10-2006-0030677 | A | 4/2006 |
| KR | 10-2017-0029063 | A | 3/2017 |
| TW | 202021023 | A | 6/2020 |

OTHER PUBLICATIONS

Written Opinion mailed Jul. 26, 2022 in corresponding PCT International Application No. PCT/JP2022/020422.
Office Action with English translation of Search Report dated Feb. 15, 2023 in corresponding Taiwanese Patent Application No. 111116743.
Request for the Submission of an Opinion dated Jan. 10, 2025 in corresponding Korean Patent Application No. 10-2023-7038870 and a machine language English translation obtained from the Global Dossier.
Extended European Search Report and Opinion dated Jul. 9, 2025 in corresponding European Patent Application No. 22804656.1.
Notice of Decision to Grant dated Aug. 27, 2025 in corresponding Korean Patent Application No. 10-2023-7038870.

* cited by examiner

F I G. 2
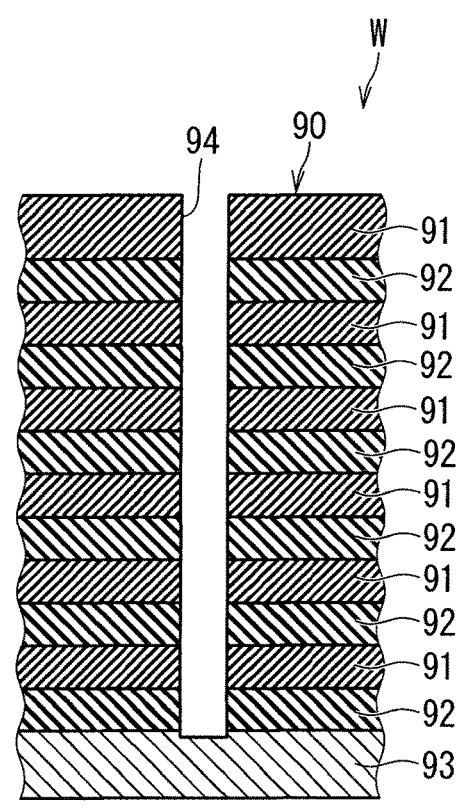
F I G. 3
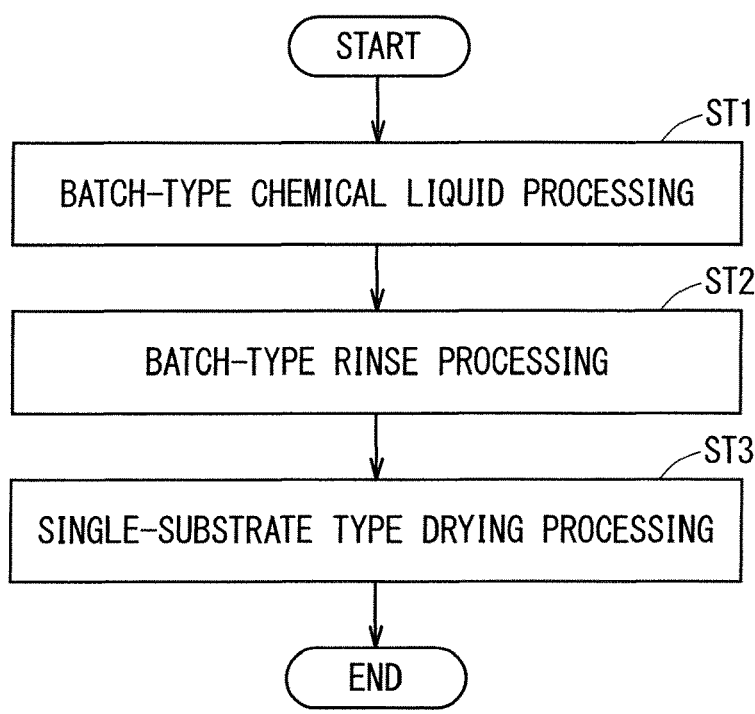

F I G. 5
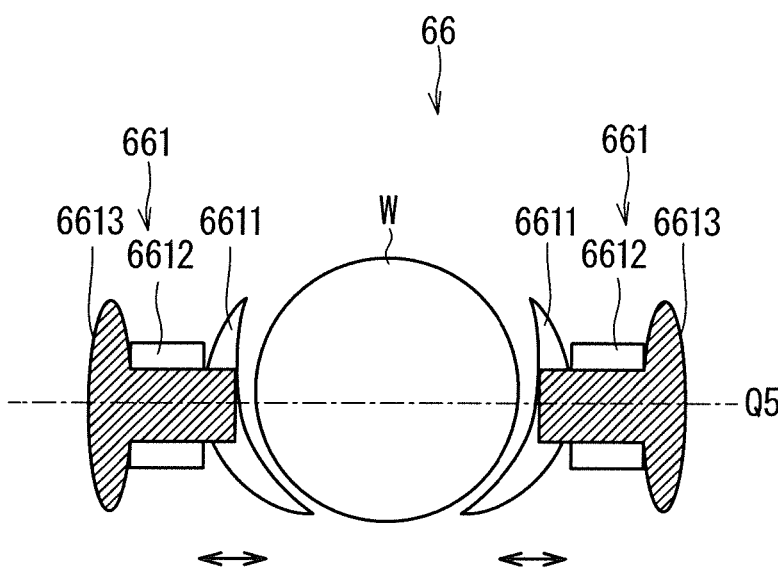
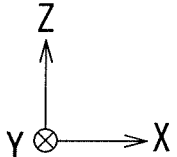

F I G. 6
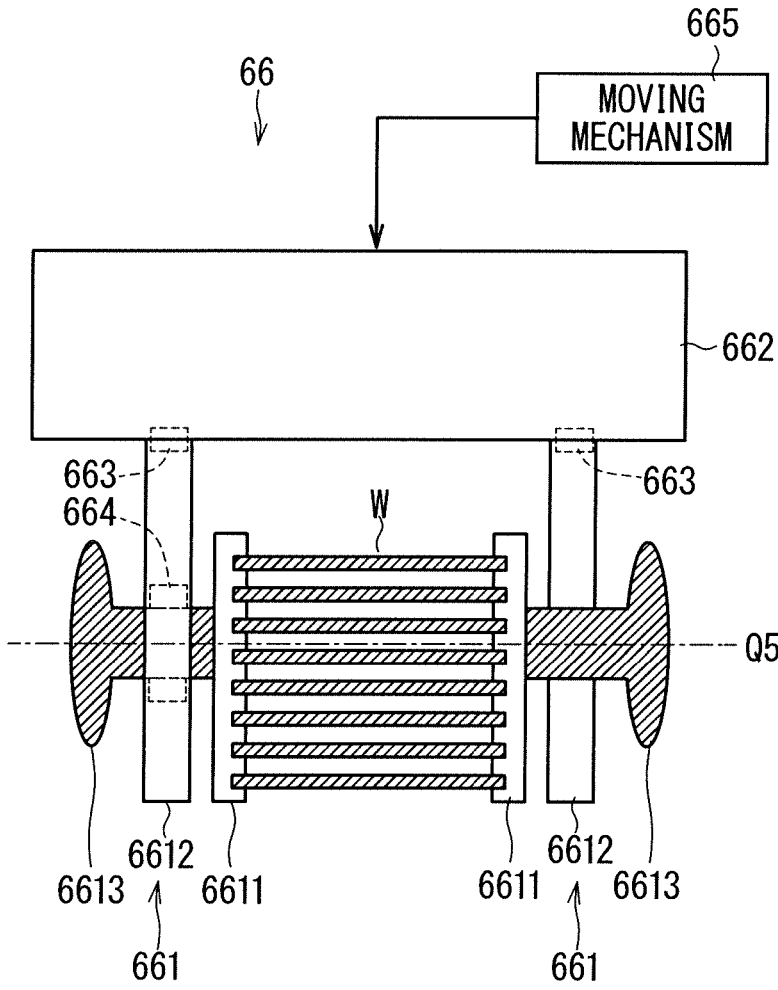

F I G. 7
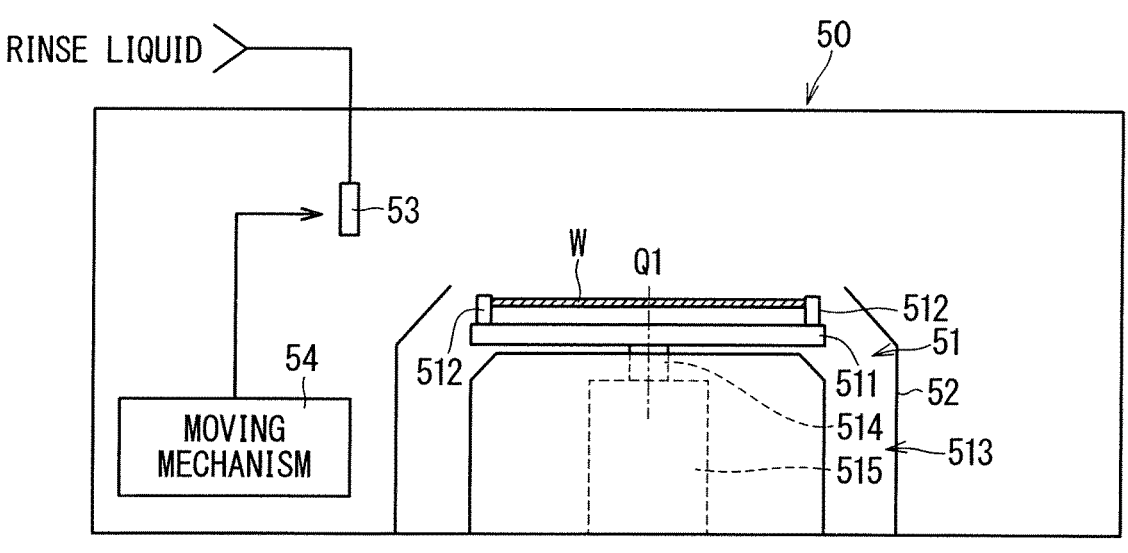
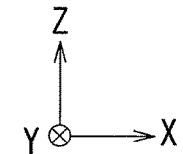
F I G. 8
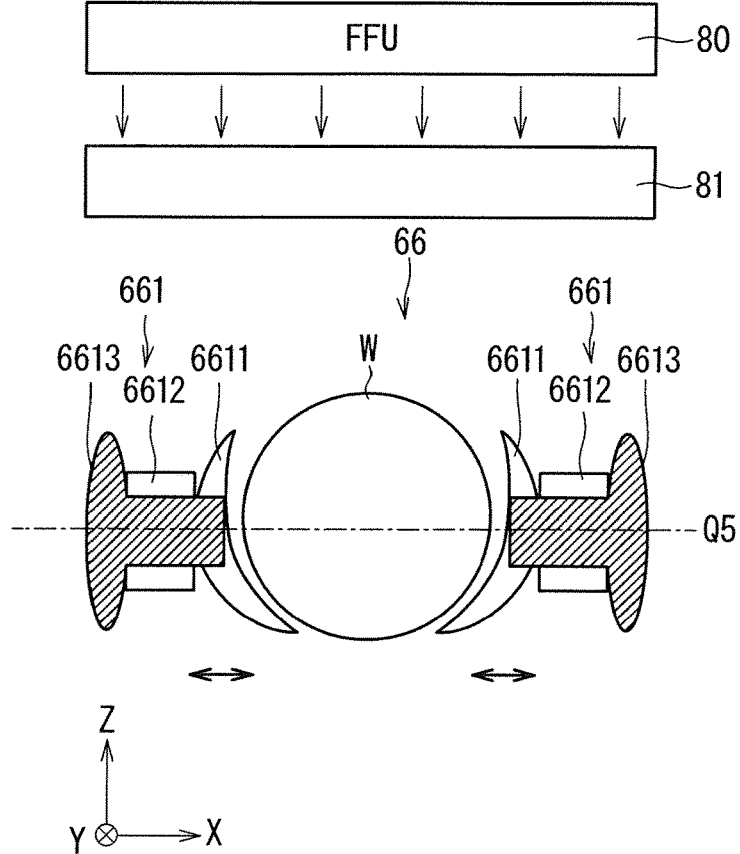

F I G.  1 1
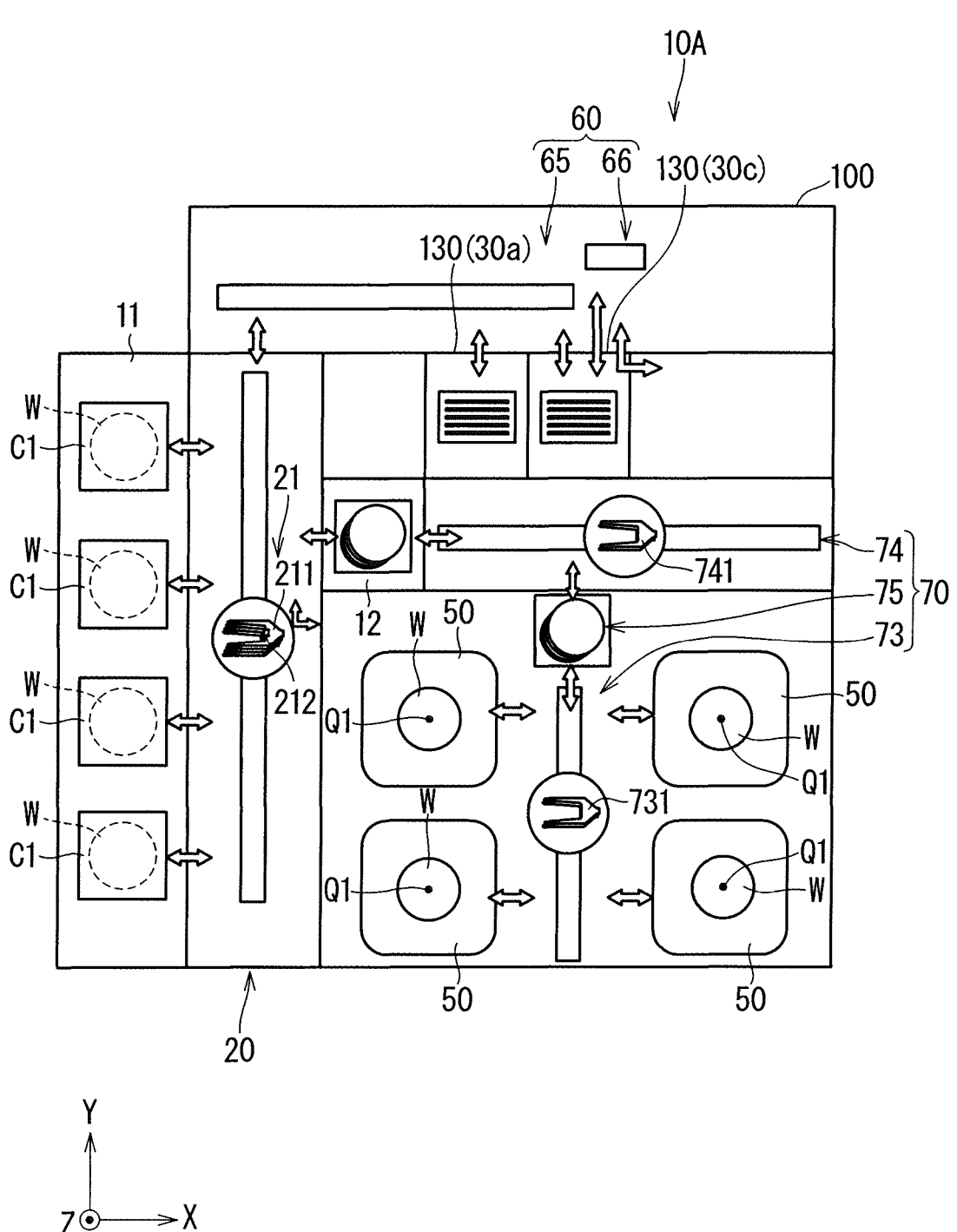

F I G. 12
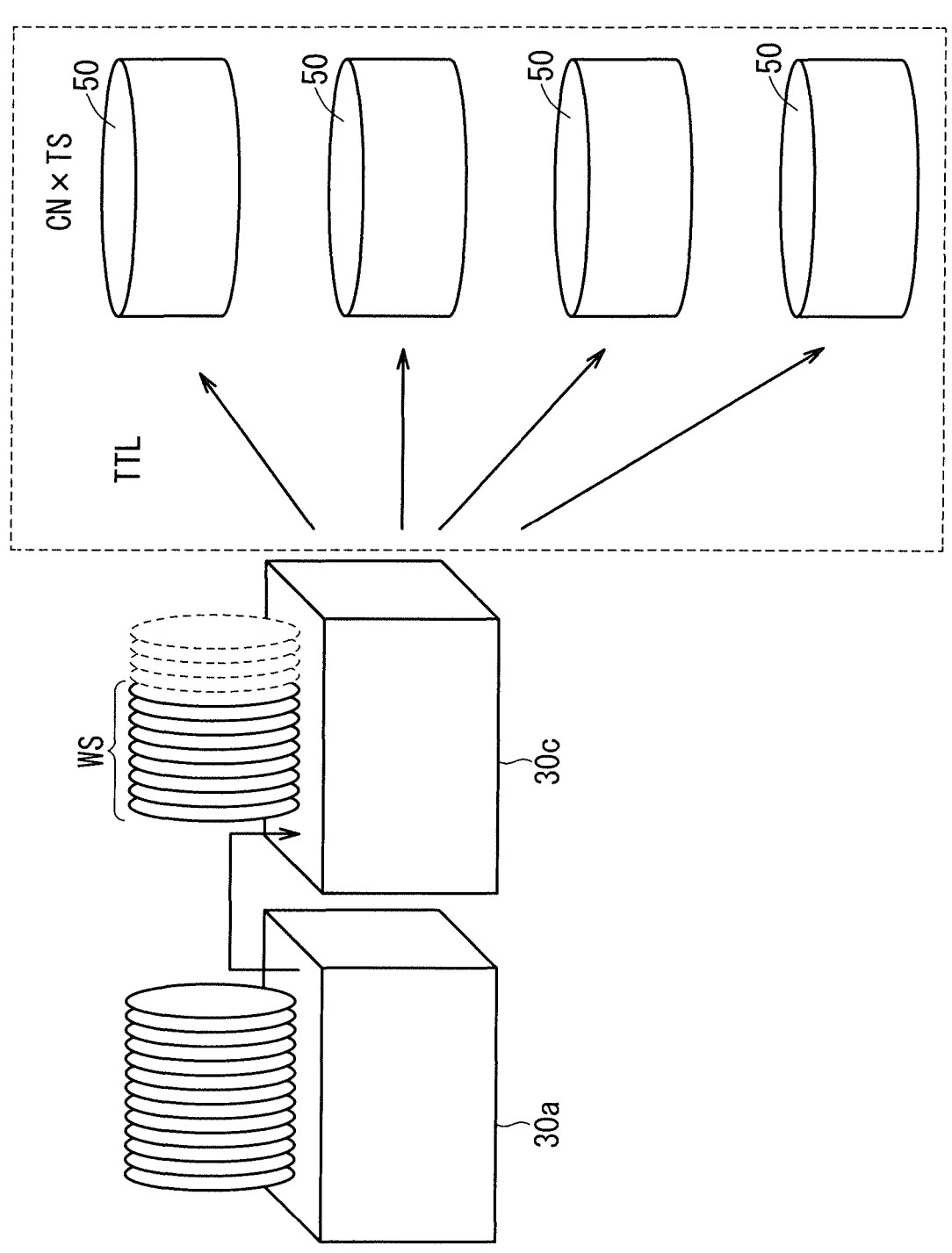

SUBSTRATE PROCESSING METHOD

CROSS-REFERENCE TO RELATED APPLICATIONS

The present application is a 35 U.S.C. §§ 371 national phase conversion of International Application No. PCT/JP2022/020422, filed May 16, 2022, which claims priority to Japanese Patent Application No. 2021-085328, filed May 20, 2021, the contents of both of which are incorporated herein by reference. The PCT International Application was published in the Japanese language.

TECHNICAL FIELD

The technique disclosed in the present description relates to substrate processing. Here, substrates to be processed include, for example, a semiconductor wafer, a glass substrate for a liquid crystal display, a substrate for a flat panel display (FPD) such as an organic electroluminescence (EL) display, a substrate for an optical disk, a substrate for a magnetic disk, a substrate for a magneto-optical disk, a glass substrate for a photomask, a ceramic substrate, a substrate for a field emission display (that is, FED), or a substrate for a solar cell.

BACKGROUND ART

Conventionally, a batch-type processing apparatus (hereinafter, also referred to as a batch processing unit), has been proposed, that etches a silicon nitride film on a substrate by using phosphoric acid (with reference to, for example, Patent Document 1). Since the batch processing apparatus can collectively process a plurality of the substrates, throughput is high.

PRIOR ART DOCUMENT

Patent Document

Patent Document 1: Japanese Unexamined Patent Application Publication (Translation of PCT Application) No. 2016-502275

SUMMARY

Problem to be Solved by the Invention

When the substrates subjected to chemical liquid processing by the batch processing apparatus described above are cleaned and further dried, drying processing may be insufficient in a case where surface patterns to be formed on the substrates are complicated ones (for example, three-dimensional structures).

On the other hand, the single-substrate type processing apparatus (hereinafter, also referred to as single substrate processing unit) that processes the substrates one by one has a high drying capability, and thus can appropriately perform the drying processing described above.

In a case where the drying processing is performed by the single substrate processing unit, when a waiting period of time until the substrates processed by the batch processing unit is processed by the single substrate processing unit becomes longer, efficiency of the entire substrate processing decreases.

The technique disclosed in the present description has been made in view of problems described above, and is a technique for efficiently advancing the entire substrate processing in the substrate processing using the batch processing unit and the single substrate processing unit.

Means to Solve the Problem

A substrate processing method according to a first aspect of the technique disclosed in the present description is a substrate processing method for performing substrate processing by using a batch processing unit that performs the substrate processing including chemical liquid processing on a plurality of substrates, and at least one single substrate processing unit that performs the substrate processing including drying processing on one of the substrates, the method including: a process of calculating a required period of time that is a period of time taken for the substrates to complete the substrate processing in the single substrate processing unit according to a standby number that is a number of the substrates after being subjected to the chemical liquid processing in the batch processing unit and before being subjected to the drying processing in the single substrate processing unit; and a process of controlling a start timing of the chemical liquid processing in the batch processing unit to make the required period of time shorter than a period of time taken for the chemical liquid processing in the batch processing unit.

A substrate processing method according to a second aspect of the technique disclosed in the present description relates to the substrate processing method according to the first aspect, in which the required period of time includes a remaining period of time for the substrate processing in progress.

A substrate processing method according to a third aspect of the technique disclosed in the present description is a substrate processing method for performing substrate processing by using a batch processing unit that performs the substrate processing including chemical liquid processing on a plurality of substrates, and at least one single substrate processing unit that performs the substrate processing including drying processing on one of the substrates, the method including: a process of calculating a required period of time that is a period of time taken for the substrates to complete the substrate processing in the single substrate processing unit according to a standby number that is a number of the substrates after being subjected to the chemical liquid processing in the batch processing unit and before being subjected to the drying processing in the single substrate processing unit; and a process of changing a processing number of the substrates in the batch processing unit to make the required period of time shorter than a period of time taken for the chemical liquid processing in the batch processing unit.

A substrate processing method according to a fourth aspect of the technique disclosed in the present description relates to the substrate processing method according to any one of the first to third aspects, and further includes a process of performing cleaning processing by immersing the plurality of substrates in a cleaning tank after being subjected to the chemical liquid processing in the batch processing unit, in which the process of calculating the required period of time is a process of calculating the required period of time including a period of time taken for the cleaning processing according to the standby number of the substrates immersed in the cleaning tank.

A substrate processing method according to a fifth aspect of the technique disclosed in the present description relates to the substrate processing method according to any one of the first to third aspects, and further includes a process of performing the cleaning processing on the substrates before being subjected to the drying processing in the single substrate processing unit.

A substrate processing method according to a sixth aspect of the technique disclosed in the present description relates to the substrate processing method according to the fifth aspect, in which the process of calculating the required period of time is a process of calculating the required period of time including the period of time taken for the cleaning processing according to the standby number of the substrates before moving from the batch processing unit to the single substrate processing unit.

A substrate processing method according to a seventh aspect of the technique disclosed in the present description relates to the substrate processing method according to any one of the first to sixth aspects, and the chemical liquid processing is performed in the batch processing unit by immersing the substrates in a chemical liquid tank, and the method further includes a process of performing the cleaning processing by immersing the plurality of substrates after being subjected to the chemical liquid processing in the cleaning tank in the batch processing unit, in which the chemical liquid tank includes a first region in which the chemical liquid processing is started at a first start timing, and a second region in which the chemical liquid processing is started at a second start timing that is a timing different from the first start timing, and the cleaning tank includes a third region in which the cleaning processing is performed on the substrates subjected to the chemical liquid processing in the first region, and a fourth region in which the cleaning processing is performed on the substrates subjected to the chemical liquid processing in the second region.

A substrate processing method according to an eighth aspect of the technique disclosed in the present description relates to the substrate processing method according to any one of the first to seventh aspects, in which the required period of time includes a period of time taken for the substrates to move from the batch processing unit to the single substrate processing unit.

A substrate processing method according to a ninth aspect of the technique disclosed in the present description relates to the substrate processing method according to any one of the first to eighth aspects, in which the required period of time includes a period of time taken for posture changing for the substrates subjected to the substrate processing in the batch processing unit to be subjected to the substrate processing in the single substrate processing unit.

A substrate processing method according to a tenth aspect of the technique disclosed in the present description relates to the substrate processing method according to any one of the first to ninth aspects, in which in a case where the standby number of the substrates are distributed to a plurality of the single substrate processing units, the required period of time includes a period of time taken for the substrate processing to be repeatedly performed in one of the single substrate processing units.

Effects of the Invention

According to at least the first and third aspects of the technique disclosed in the present description, it is possible to suppress an increase in the number of the substrates waiting until the drying processing is performed in the single substrate processing unit after the chemical liquid processing is performed in the batch processing unit. Accordingly, it is possible to efficiently advance the entire substrate processing to be performed by the batch processing unit and the single substrate processing unit.

Further, objects, features, aspects, and advantages related to the technique disclosed in the present description will be more apparent with reference to detailed descriptions below and the accompanying drawings.

BRIEF DESCRIPTION OF DRAWINGS

FIG. 2 shows a diagram partially and schematically showing an example of a three-dimensional structure to be formed on a substrate.

FIG. 3 shows a flowchart schematically showing an example of a processing process on the substrate according to an embodiment.

FIG. 5 shows a diagram schematically showing an example of a configuration of a transfer robot.

FIG. 6 shows a diagram schematically showing an example of the configuration of the transfer robot.

FIG. 7 shows a diagram schematically showing an example of a configuration of a single substrate processing unit.

FIG. 8 shows a diagram schematically showing an example of the configuration of the transfer robot and a periphery thereof.

FIG. 11 shows a plan view schematically showing an example of the configuration of the substrate processing apparatus according to an embodiment.

FIG. 12 shows a conceptual diagram schematically showing a relationship of Expression (3).

DESCRIPTION OF EMBODIMENTS

Figure 1:
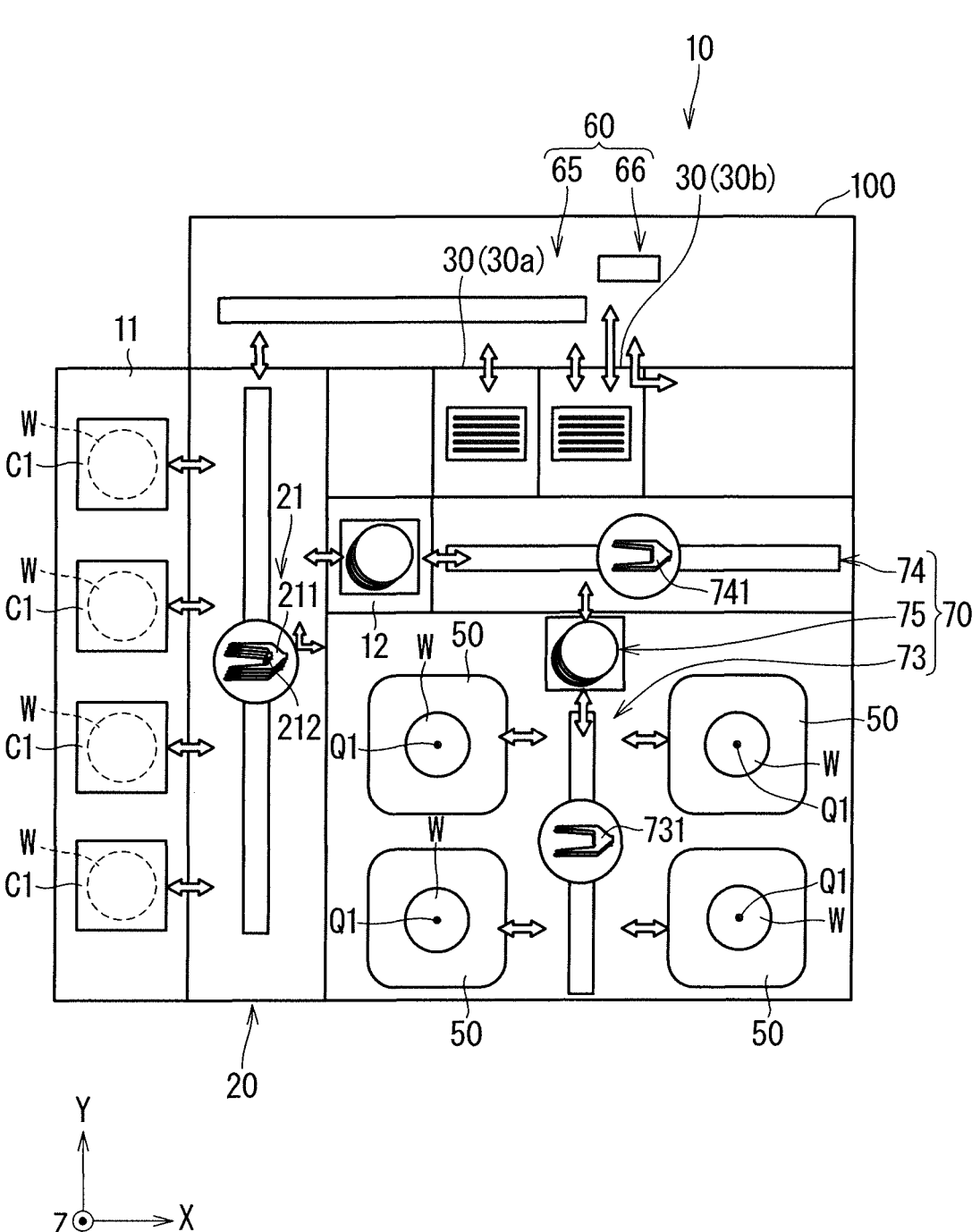
FIG. 1 shows a plan view schematically showing an example of a configuration of a substrate processing apparatus according to an embodiment.

Hereinafter, the embodiments will be described with reference to the accompanying drawings. In the embodiments below, detailed features and the like are also shown for the description of the technique, but are merely examples, and not all of the features are necessarily essential features for enabling the embodiments to be carried out.

Note that the drawings are schematically shown, and for example, omission of the configurations, or simplification of the configurations is appropriately made in the drawings for convenience of the description. Further, a mutual relationship of sizes and positions of the configurations and the like shown in different drawings is not necessarily accurately described, and can be appropriately changed. Further, hatching may be applied to the drawings such as a plan view rather than a cross-sectional view in order to facilitate understanding of content of the embodiments.

Further, in descriptions shown below, similar components are denoted and illustrated by the same reference numerals, and names and functions of the components are also similar. Therefore, detailed descriptions thereof may be omitted in order to avoid duplication.

Further, in the descriptions described in the present description, in a case where there is an expression of for example, "comprising", "including", or "having" a certain component, the expression is not an exclusive expression excluding presence of other components unless otherwise specified.

Further, in the descriptions described in the present description, even in a case where ordinal numbers such as "first" or "second" are used, these terms are used for convenience to facilitate the understanding of the content of the embodiments, and the content of the embodiments are not limited to an order or the like that may arise from these ordinal numbers.

Further, in the descriptions described in the present description, an expression such as " . . . axis positive direction" or " . . . axis negative direction" indicates that a direction along an arrow of a . . . axis illustrated is set to be a positive direction, and a direction opposite to the arrow of the . . . axis illustrated is set to be a negative direction.

Further, in the descriptions described in the present description, even in a case where terms meaning specific positions or directions such as "upper", "lower", "left", "right", "side", "bottom", "front", or "back" are used, these terms are used for convenience to facilitate the understanding of the contents of the embodiments, and are not related to the positions or directions when the embodiments are actually implemented.

First Embodiment

Hereinafter, the substrate processing method according to the present embodiment will be described.
<Regarding Overall Configuration of Substrate Processing Apparatus>

FIG. 1 shows a plan view schematically showing an example of a configuration of a substrate processing apparatus 10 according to the present embodiment. In FIG. 1, a Z-axis direction is a vertically upward direction. The substrate processing apparatus 10 is an apparatus that performs wet processing on substrates W.

The substrate W is, for example, a semiconductor substrate, and has a surface pattern formed on a surface thereof. Specific examples of the surface patterns include a three-dimensional structure to be formed during manufacturing of a three-dimensional NAND (Not-AND) flash memory.

FIG. 2 shows a diagram partially and schematically showing an example of the three-dimensional structure to be formed on the substrate W. In the example of FIG. 2, the substrate W includes a support layer 93. The support layer 93 is, for example, a silicon layer. Then, a laminated structure 90 is formed on an upper surface of the support layer 93.

The laminated structure 90 includes a plurality of insulating films 91 and a plurality of sacrificial films 92. The insulating films 91 and the sacrificial films 92 are alternately laminated in the Z-axis direction. The insulating films 91 are, for example, silicon dioxide films, and the sacrificial films 92 are, for example, silicon nitride films. The thicknesses of the insulating films 91 and the sacrificial films 92 are, for example, 1 nm or more and 50 nm or less.

Further, a trench 94 is formed in a laminated structure 90. The trench 94 penetrates the laminated structure 90 in a thickness direction of the substrate W. Further, a pillar not shown is disposed in the laminated structure 90. The pillar supports the insulating films 91 in a case where the sacrificial films 92 are removed. A width of the pillar (a width parallel to a main surface of the substrate W) is, for example, 1 nm or more and 50 nm or less.

Regarding the present embodiment, as a specific example, a case where the substrate processing apparatus 10 etches the sacrificial films 92 will be described, but the substrate processing apparatus 10 may perform other processing on the substrate W. Hereinafter, an example of the overall configuration of the substrate processing apparatus 10 will be outlined, followed by a detailed description of an example of each configuration.

As exemplified in FIG. 1, the substrate processing apparatus 10 includes batch processing units 30 that collectively process a plurality of substrates W (that is, perform batch-type substrate processing); single substrate processing units 50 that process the substrates one by one (that is, perform single-substrate type substrate processing); an inter-batch transfer unit 60; and a batch-single transfer unit 70.

Further, in the example of FIG. 1, the substrate processing apparatus 10 includes a housing 100, and the housing 100 houses at least the batch processing units 30, the single substrate processing units 50, the inter-batch transfer unit 60, and the batch-single transfer unit 70. In other words, in the example of FIG. 1, the substrate processing apparatus 10 is a hybrid-type substrate processing apparatus in which the batch processing units 30 and the single substrate processing units 50 are disposed in the same housing 100.

In the example of FIG. 1, a load port 11 is also disposed in the substrate processing apparatus 10 as a carry-in port through which the plurality of substrates W are carried in from outside. Portable containers (hereinafter, referred to as carriers C1) for housing the plurality of substrates W are carried into the load port 11. In the example of FIG. 1, in the load port 11, a plurality of the carriers C1 are placed in a line along a Y-axis direction.

As the carrier C1, a front opening unified pod (FOUP) that houses the substrates W in a sealed space, a standard mechanical interface (SMIF) pod, or an open cassette (OC) that exposes the substrates W to outside air, may be adopted. Here, the plurality of substrates W are housed in the carriers C1 in a horizontal form in which the surfaces of the substrates face a Z-axis positive direction and in a state where the substrates are arranged in the Z-axis direction. The horizontal form referred to herein is a form in which the thickness direction of the substrates W is along the Z-axis direction. The number of the substrates W to be housed in the carriers C1 is not particularly limited, but is, for example, 25.

In the example of FIG. 1, an indexer transfer unit 20 that transfers the plurality of substrates W between each of the carriers C1 and the inter-batch transfer unit 60 is also disposed in the substrate processing apparatus 10. The indexer transfer unit 20 is disposed in the housing 100. The indexer transfer unit 20 collectively takes out the plurality of substrates W from the each of the carriers C1, changing the forms of the substrates W from the horizontal form to an upright form, and transfers the plurality of substrates W in the upright form to the inter-batch transfer unit 60. The upright form referred to herein is a form in which the thickness direction of the substrate W is along the horizontal direction.

For example, the indexer transfer unit 20 delivers the plurality of substrates W to the inter-batch transfer unit 60 in an upright form in which the surfaces of the substrates W face a Y-axis negative direction.

The inter-batch transfer unit 60 collectively receives the plurality of substrates W in the upright form from the indexer transfer unit 20, and sequentially transfers the plurality of substrates W received to the batch processing units 30 collectively.

The batch processing units 30 are batch-type processing apparatuses that collectively perform wet processing on the plurality of substrates W. Specifically, the batch processing units 30 include processing tanks 31 to be described later. A processing liquid is stored in the processing tanks 31. As the plurality of substrates W are immersed in the processing liquid in the processing tanks 31, the batch processing units 30 can collectively perform processing in accordance with the processing liquid on the plurality of substrates W.

In the example of FIG. 1, a plurality of the batch processing units 30 are arranged in a line along an X-axis direction. Further, in the example of FIG. 1, a batch processing unit 30*a* for the chemical liquid and a batch processing unit 30*b* for a rinse liquid are disposed as the plurality of batch processing units 30.

The processing tank 31 of the batch processing unit 30*a* stores the chemical liquid. In a case where the substrate processing apparatus 10 etches the sacrificial films 92 of the substrates W, the chemical liquid includes an etching liquid (for example, a high temperature phosphoric acid) capable of removing the sacrificial films 92. As the plurality of substrates W are immersed in the chemical liquid, the chemical liquid can act on the sacrificial films 92 through a trench 94 of each of the substrates W, and etch the sacrificial films 92.

The processing tank 31 of the batch processing unit 30*b* stores the rinse liquid. The rinse liquid contains, for example, pure water. As the plurality of substrates W subjected to the chemical liquid processing are immersed in the rinse liquid, the chemical liquid adhering to the plurality of substrates W can be replaced with the rinse liquid and cleaned.

The inter-batch transfer unit 60 receives the plurality of substrates W in the upright form from the indexer transfer unit 20 at first, and transfers the plurality of substrates W received to the batch processing unit 30*a*. The plurality of substrates W are collectively subjected to the chemical liquid processing by the batch processing unit 30*a*. In this way, for example, the sacrificial films 92 of the each of the substrates W are removed. The removal of the sacrificial films 92 causes the insulating films 91 to be no longer supported by the sacrificial films 92. Therefore, the insulating films 91 is likely to collapse.

Next, the inter-batch transfer unit 60 receives the plurality of substrates W subjected to the chemical liquid processing from the batch processing unit 30*a*, and transfers the plurality of substrates W received to the batch processing unit 30*b*. In the transfer, the plurality of substrates W are transferred in a state where the processing liquid (here, the chemical liquid) adheres to the substrates. Therefore, in the transfer, it is possible to suppress collapse of the three-dimensional structures (for example, the insulating films 91) of the substrates W due to drying.

The plurality of substrates W transferred to the batch processing unit 30*b* are collectively subjected to rinse processing by the batch processing unit 30*b*. In this way, the chemical liquid adhering to the each of the substrates W is replaced with the rinse liquid.

In the example of FIG. 1, the batch-single transfer unit 70 is disposed in the Y-axis negative direction with respect to the batch processing unit 30*b*. The batch-single transfer unit 70 receives the plurality of substrates W taken out from the batch processing unit 30*b* by the inter-batch transfer unit 60, and transfers the substrates W one by one to the single substrate processing units 50.

The batch-single transfer unit 70 takes out the substrates W to which the rinse liquid adheres from the inter-batch transfer unit 60. Then, the batch-single transfer unit 70 transfers the substrates W in the horizontal form one by one to the single substrate processing units 50.

In the example of FIG. 1, the single substrate processing units 50 are disposed in the Y-axis negative direction with respect to the batch-single transfer unit 70. Further, in the example of FIG. 1, a plurality of the single substrate processing units 50 are arranged in a matrix in plan view. As a specific example, four single substrate processing units 50 are arranged in a matrix of 2 rows by 2 columns. The batch-single transfer unit 70 transfers the substrates W one by one to each of the single substrate processing units 50.

The single substrate processing units 50 perform at least the drying processing on the substrates W. The drying processing is not particularly limited, but may be spin drying, for example. In other words, the single substrate processing units 50 may dry the substrates W by rotating the substrates W around a rotation axis Q1 passing through center portions of the substrates W and along a Z axis. Since the single substrate processing units 50 dry the substrates W one by one, the substrates W can be dried with a higher drying performance. Therefore, it is possible to suppress the collapse of the three-dimensional structures of the substrates W due to the drying.

Note that, the single substrate processing units 50 may appropriately supply, for example, the rinse liquid (the pure water) or IPA to the main surfaces of the substrates W as processing before the drying processing.

The batch-single transfer unit 70 takes out the substrate W subjected to the drying processing from the each of the single substrate processing units 50, and transfers the substrate W to the indexer transfer unit 20 via a relay unit 12. The relay unit 12 includes a container (not shown) that houses the plurality of substrates W in a state where the plurality of substrates W are arranged along the Z-axis direction.

The batch-single transfer unit 70 transfers the substrates W one by one from the single substrate processing units 50 to the relay unit 12. Each time the transfer is performed, the number of the substrates W housed in the relay unit 12 increases. When a predetermined number (for example, 25) of substrates W are housed in the relay unit 12, the indexer transfer unit 20 collectively takes out the plurality of substrates W from the relay unit 12, and transfers the plurality of substrates W to the carriers C1 of the load port 11.

<Regarding Example of Operations of Substrate Processing Apparatus>

FIG. 3 shows a flowchart schematically showing an example of a processing process on the substrates W according to the present embodiment. As exemplified in FIG. 3, batch-type chemical liquid processing is performed on the plurality of substrates W at first (step ST1).

Next, batch-type rinse processing is performed on the plurality of substrates W (step ST2). Note that, as described later, the rinse processing may be single-substrate type rinse processing.

Next, single-substrate type drying processing is performed on each of the substrates W (step ST3).

The substrates W dried by the single substrate processing units 50 are transferred to the carriers C1 via the batch-single transfer unit 70, the relay unit 12, and the indexer transfer unit 20.

Note that a description will be given later of control of a start timing of the chemical liquid processing sequentially performed in the batch processing unit and control of the number of substrates W to be subjected to the chemical liquid processing in the batch processing unit.

As described above, with the substrate processing apparatus 10, the batch processing unit 30 can collectively process the plurality of substrates W (steps ST1 and ST2). In this way, the substrates W can be processed with a high throughput.

Then, since the plurality of substrates W are in a state where the rinse liquid adheres to the substrates after batch-type processing, it is possible to suppress drying of the substrates W during transfer from the batch processing unit 30b to the single substrate processing units 50. Therefore, it is possible to suppress the collapse of the three-dimensional structures of the substrates W due to the drying.

Further, the substrates W are subjected to the drying processing one by one by the single substrate processing units 50 (step ST3). In other words, in the present embodiment, the single-substrate type drying processing instead of batch-type drying processing is performed after batch-type wet processing. Therefore, the substrates W can be dried with a high drying performance. Therefore, it is possible to suppress the collapse of the three-dimensional structures of the substrates W due to the drying.

<Regarding Specific Examples of Respective Configurations>

Hereinafter, specific examples of respective configurations of the substrate processing apparatus 10 will be described.

<Regarding Indexer Transfer Unit>

In the example of FIG. 1, the indexer transfer unit 20 includes a transfer robot 21. The transfer robot 21 is disposed to be movable along the Y-axis direction in an X-axis positive direction with respect to the load port 11. The transfer robot 21 can stop at a position to face corresponding carriers C1 placed on the load port 11 in the X-axis direction.

In the example of FIG. 1, the transfer robot 21 includes a plurality of (for example, 25) hands 211 and upright support members 212. The plurality of hands 211 are disposed side by side in the Z-axis direction. The transfer robot 21 takes out the plurality of substrates W unprocessed from the carriers C1 by moving the plurality of hands 211. In this way, one substrate W is placed on a corresponding one of the hands 211.

Disposed on corresponding hands 211 are the upright support members 212 that support the substrates W at root portions of the hands. The upright support members 212 are disposed to be movable in the X-axis direction, and move in an X-axis negative direction in a state where the substrates W are held on the hands 211 to sandwich end portions of the substrates W in the X-axis negative direction in the thickness direction of the substrates.

Here, the transfer robot 21 has a posture changing function of changing the forms of the plurality of substrates W from the horizontal form to the upright form. Specifically, the transfer robot 21 rotates the plurality of hands 211 by 90 degrees about a rotation axis along the Y-axis direction. Such rotation is implemented by, for example, a motor. In this way, the thickness direction of the substrates W is along the X-axis direction. Further, the transfer robot 21 rotates the plurality of hands 211 by 90 degrees about a rotation axis along the Z-axis direction. Such rotation is also implemented by, for example, a motor. In this way, the thickness direction of the substrates W is along the Y-axis direction. Here, the transfer robot 21 changes the forms of the substrates W such that the surfaces of the substrates W face the Y-axis negative direction. Then, the transfer robot 21 moves to an end of a movement path in a Y-axis positive direction while holding the plurality of substrates W, and delivers the plurality of substrates W to the inter-batch transfer unit 60.

As described above, the indexer transfer unit 20 takes out the plurality of substrates W unprocessed from the carriers C1, changes the forms of the substrates W into the upright form, and transfers the plurality of substrates W in the upright form to the inter-batch transfer unit 60.

Further, the transfer robot 21 collectively takes out the plurality of substrates W processed from the relay unit 12 at a predetermined position on the movement path. Then, the transfer robot 21 houses the plurality of substrates W processed in the carriers C1 of the load port 11.

<Regarding Batch Processing Unit>

Next, the batch processing unit 30 will be described. In the example of FIG. 1, a plurality of the batch processing units 30 are arranged in a line along the X-axis direction.

Figure 4:
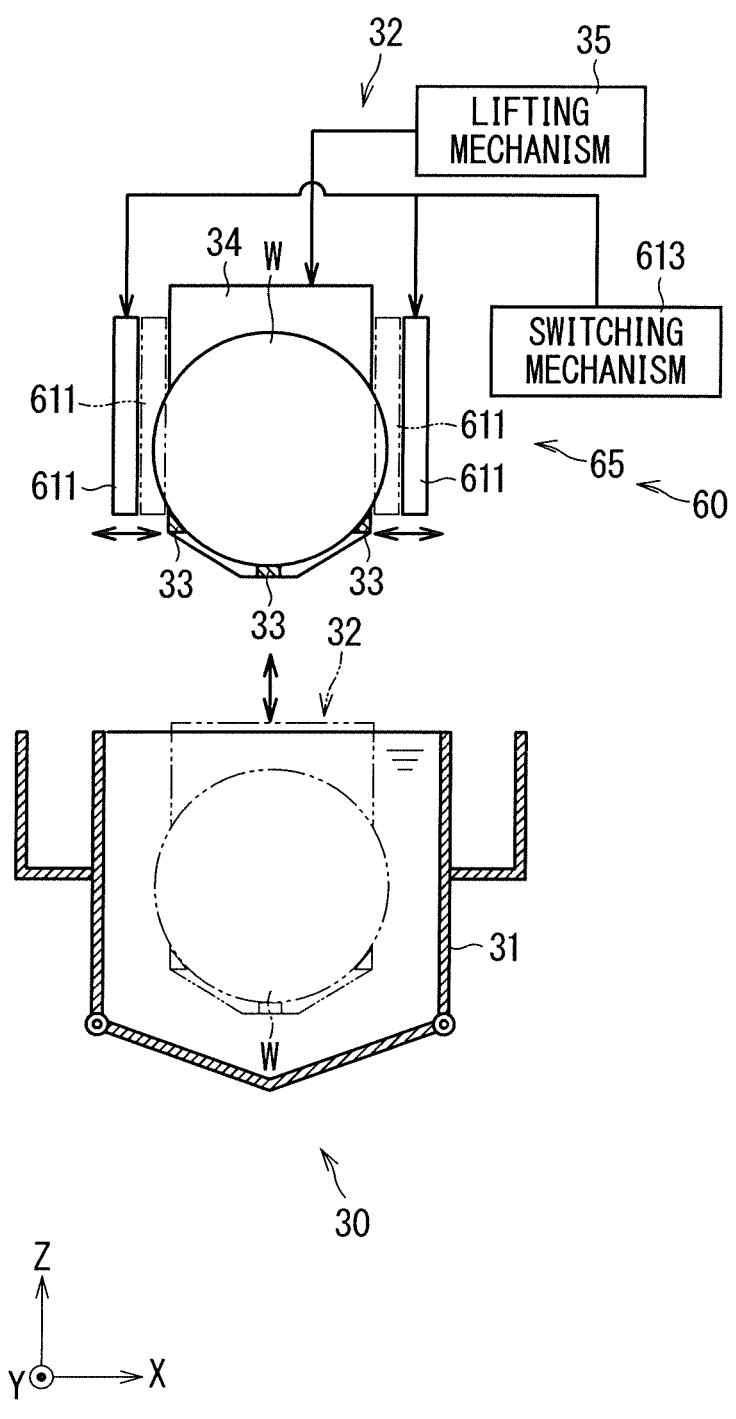
FIG. 4 shows a diagram schematically showing an example of a configuration of a batch processing unit.

FIG. 4 shows a diagram schematically showing an example of a configuration of the batch processing unit 30. The batch processing unit 30 includes the processing tank 31 and a lifter 32. The processing tank 31 has a box shape opened in the Z-axis positive direction and stores the processing liquid.

The lifter 32 includes a plurality of (three in the drawing) holding members 33 that hold the plurality of substrates W in the upright form, a base 34 that supports the holding members 33, and a lifting mechanism 35 that raises and lowers the base 34. Each of the holding members 33 has an elongated shape extending in the Y-axis direction, and has a base end portion in the Y-axis positive direction attached to the base 34. A plurality of grooves (not shown) are formed in the each of the holding members 33 side by side in the Y-axis direction. The pitches of the grooves are equal to the pitches of the plurality of substrates W. Since the end portions of the substrates W are inserted into corresponding grooves of the each of holding members 33, the plurality of holding members 33 hold the plurality of substrates W in the upright form. The base 34 has a plate shape, and is disposed in a form in which the thickness direction of the base is along the Y-axis direction. The lifting mechanism 35 raises and lowers the plurality of substrates W held by the holding members 33 by raising and lowering the base 34. Hereinafter, a subject being raised and lowered by the lifting mechanism 35 may be described as the lifter 32.

The lifter 32 raises and lowers the plurality of substrates W between a delivery position in the Z-axis positive direction with respect to the processing tank 31 and a processing position in the processing tank 31. The delivery position is a position at which the plurality of substrates is delivered between the lifter 32 and the inter-batch transfer unit 60. In the example of FIG. 4, the lifter 32 located at the delivery position is indicated by a solid line. The processing position is a position where the plurality of substrates W are immersed in a processing liquid. As the lifter 32 moves the plurality of substrates W to the processing position, processing is performed on the plurality of substrates W. In the example of FIG. 4, the lifter 32 and the substrates W located at the processing position are schematically indicated by two-dot chain lines.

Here, the number of the substrates W to be processed in the processing tank 31 is not limited to a case where the number of the substrates to be processed is equal to the number of the substrates W corresponding to a total capacity that can be accommodated in the processing tank 31, and may be, for example, the number of the substrates W corresponding to half of the total capacity that can be accommodated in the processing tank 31.

In this case, the processing tank 31 may be divided into a plurality of regions, and the substrate processing (including the chemical liquid processing and the rinse processing)

at different start timings may be performed in corresponding regions. For example, it is possible to dispose two regions in the processing tank 31 of the batch processing unit 30a in FIG. 1, perform the chemical liquid processing in each of the regions, dispose two corresponding regions also in the processing tank 31 of the batch processing unit 30b, and perform the rinse processing in each of the regions.

Note that a supply unit that supplies the processing liquid to the processing tank 31 and a discharge unit that discharges the processing liquid from the processing tank 31 is disposed in the batch processing unit 30. Further, if necessary, at least one of a gas supply unit that supplies a gas to the processing liquid inside the processing tank 31 and a circulation unit that returns the processing liquid overflowed from the Z-axis positive direction of the processing tank 31 to the processing tank 31 again may be disposed in the batch processing unit 30.

<Regarding Inter-Batch Transfer Unit>

The inter-batch transfer unit 60 includes a transfer robot 65 and a transfer robot 66. In the example of FIG. 4, the transfer robot 65 of the inter-batch transfer unit 60 includes a pair of holding members 611 and a switching mechanism 613.

The holding members 611 are members that hold the plurality of substrates W in the upright form. The holding members 611 are disposed side by side in the X-axis direction, and are attached to a base member not shown in a displaceable manner.

The switching mechanism 613 displaces the holding members 611 between corresponding closing positions and corresponding opening positions. The closing positions are positions where an interval between two holding members 611 is narrow, and are positions where the holding members 611 sandwich the plurality of substrates W. In the example of FIG. 4, the holding members 611 located at the closing positions are schematically shown by a two-dot chain line. The opening positions are positions where an interval between the two holding members 611 is wider than an interval at the closing positions, and are positions where the holding members 611 release holding of the plurality of substrates W. The switching mechanism 613 includes, for example, a motor or an air cylinder.

The transfer robot 65 is disposed to be movable in the X-axis direction immediately above the batch processing unit 30a and the batch processing unit 30b. A moving mechanism (for example, a ball screw mechanism) of the transfer robot 65 is disposed in the Y-axis positive direction with respect to the batch processing unit 30. The transfer robot 65 receives the plurality of substrates W in the upright form from the indexer transfer unit 20 (for example, the transfer robot 21) at an end portion of the robot in the X-axis negative direction in the movement path. Here, the transfer robot 65 receives the plurality of substrates W in the upright form in which the surfaces of the substrates W face the Y-axis positive direction. Then, the transfer robot 65 transfers the plurality of substrates W to the batch processing unit 30a and the batch processing unit 30b in an order.

The transfer robot 66 is disposed to be movable along the X-axis direction immediately above the batch processing unit 30b. The transfer robot 66 receives the plurality of substrates W in the upright form from the batch processing unit 30b, and transfers the plurality of substrates W to the batch-single transfer unit 70.

Further, the transfer robot 66 receives the plurality of substrates W in the upright form from the batch processing unit 30b, and changes the forms of the plurality of substrates W from the upright form to the horizontal form.

FIGS. 5 and 6 show diagrams schematically showing examples of configurations of the transfer robot 66. FIG. 5 shows the transfer robot 66 when viewed along the Y-axis direction, and FIG. 6 shows the transfer robot 66 when viewed along the Z-axis direction.

As exemplified in FIGS. 5 and 6, the transfer robot 66 includes a pair of holding members 661, a base 662, switching mechanisms 663, and a rotating mechanism 664. The holding members 661 are members that hold the plurality of substrates W.

The holding members 661 include contact members 6611, support members 6612, and rotating members 6613. Each of the support members 6612 has, for example, an elongated shape elongated in the Y-axis direction, and has a base end portion in the Y-axis positive direction attached to be displaceable with respect to the base 662. Two support members 6612 are spaced apart from each other in the X-axis direction.

The switching mechanisms 663 displace the support members 6612 between the corresponding opening positions and the corresponding closing positions. The closing positions are positions where an interval between two support members 6612 is narrow, and are positions where the holding members 661 support the plurality of substrates W. The opening positions are positions where the interval between the two support members 6612 is wide, and are positions where the holding members 661 release holding of the substrates W. The switching mechanisms 663 include, for example, motors or air cylinders.

Each of the rotating members 6613 is attached to the support member 6612 to be rotatable about a rotation axis Q5. The rotation axis Q5 is an axis along the X-axis direction. Two rotating members 6613 are disposed coaxially.

The contact members 6611 are disposed at end portions of the rotating members 6613 on sides close to each other. In other words, the contact member 6611 located in the X-axis negative direction is disposed at an end portion in the X-axis positive direction of the rotating member 6613 in the X-axis negative direction, and the contact member 6611 located in the X-axis positive direction is disposed at an end portion in the X-axis negative direction of the rotating member 6613 in the X-axis positive direction.

The contact members 6611 are displaced integrally with the support members 6612 and the rotating members 6613 with respect to the base 662. Therefore, as the switching mechanisms 663 move the support members 6612 to the closing positions, the interval between the contact members 6611 becomes narrower. At the closing positions, the contact members 6611 support the plurality of substrates W in the upright form.

In the example of FIG. 5, the contact members 6611 has an arc shape in which the interval between the contact members 6611 becomes narrower toward a Z-axis negative direction. In the closing positions, a portion of each of the contact members 6611 in the Z-axis negative direction comes into contact with side surfaces of the plurality of substrates W to support the plurality of substrates W. Further, a plurality of grooves arranged along the Y-axis direction is formed on surfaces of the contact members 6611 facing each other. Pitches of the grooves are equal to pitches of the plurality of substrates W. As the end portions of the substrates W are inserted into the corresponding grooves, the individual substrates W are supported also in the Y-axis direction by the respective contact members 6611. In this way, the substrates W are maintained in the upright form.

Note that each of the grooves of the contact members 6611 has a shape that allows the each of the substrates W to be pulled out from the contact members 6611 in the Z-axis positive direction. Hereinafter, end portions of the contact members 6611 in the Z-axis positive direction in the upright form may be referred to as access side end portions.

The rotating mechanism 664 rotates the rotating members 6613 about the rotation axis Q5 by 90 degrees with respect to the support members 6612. In this way, the plurality of substrates W held by the contact members 6611 are also rotated by 90 degrees around the rotation axis Q5, and the forms of the substrates W are changed from the upright form to the horizontal form. Here, the rotating mechanism 664 rotates the plurality of substrates W by 90 degrees such that the surfaces of the substrates W face the Z-axis positive direction and the access side end portions of the contact members 6611 face the Y-axis negative direction.

The moving mechanism 665 moves the base 662 along the X-axis direction. In this way, the plurality of substrates W held by the holding members 661 can be moved along the X-axis direction.

Here, a procedure of transfer from the inter-batch transfer unit 60 to the batch-single transfer unit 70 will be described. First, the moving mechanism 665 moves the transfer robot 66 to the delivery position corresponding to the batch processing unit 30b. Next, the switching mechanisms 663 move the holding members 661 to the opening positions, and the lifter 32 raises the plurality of substrates W. In this way, the plurality of substrates W are positioned between the two holding members 661. Next, the switching mechanism 663 moves the holding member 661 to the closed positions. In this way, the holding members 661 hold the plurality of substrates W. Next, the lifter 32 is lowered to a standby position, and the rotating mechanism 664 rotates the rotating members 6613 by 90 degrees. In this way, the surfaces of the plurality of substrates W face the Z-axis positive direction, and the access side end portions of the holding members 661 face the Y-axis negative direction.

Then, the substrates W are transferred to the batch-single transfer unit 70, and the batch-single transfer unit 70 can further transfer the substrates W in the horizontal form to the corresponding single substrate processing units 50.

<Regarding Single Substrate Processing Unit>

FIG. 7 shows a diagram schematically showing an example of a configuration of the single substrate processing unit 50. The single substrate processing unit 50 includes a substrate holding unit 51. The substrate holding unit 51 holds the substrate W in the horizontal form. In the example of FIG. 7, the substrate holding unit 51 includes a stage 511 and a plurality of chuck pins 512. The stage 511 has a disk shape and is disposed in the Z-axis negative direction with respect to the substrate W. The stage 511 is disposed in a form in which a thickness direction of the stage is along the Z-axis direction.

The plurality of chuck pins 512 is disposed on a main surface (that is, an upper surface) of the stage 511 in the Z-axis positive direction. Each of the chuck pins 512 is disposed to be displaceable between a chuck position in contact with a peripheral edge of the substrate W and a release position away from the peripheral edge of the substrate W. In a case where the plurality of chuck pins 512 move to corresponding chuck positions, the plurality of chuck pins 512 hold the substrate W. When the plurality of chuck pins 512 move to corresponding release positions, holding of the substrate W is released.

In the example of FIG. 7, the substrate holding unit 51 further includes a rotating mechanism 513, and rotates the substrate W around the rotation axis Q1. The rotation axis Q1 is an axis passing through a center portion of the substrate W and extending in the Z-axis direction. For example, the rotating mechanism 513 includes a shaft 514 and a motor 515. An end portion (that is, an upper end) of the shaft 514 in the Z-axis positive direction is connected to a main surface (that is, a lower surface) of the stage 511 in the Z-axis negative direction, and extends from the lower surface of the stage 511 along the rotation axis Q1. The motor 515 rotates the shaft 514 around the rotation axis Q1 to integrally rotate the stage 511 and the plurality of chuck pins 512. In this way, the substrate W held by the plurality of chuck pins 512 rotates around the rotation axis Q1. Such substrate holding unit 51 may also be referred to as a spin chuck.

As the substrate holding unit 51 rapidly rotates the substrate W around the rotation axis Q1, a liquid adhering to the substrate W can be scattered from the peripheral edge of the substrate W to dry the substrate W (so-called the spin drying).

In the example of FIG. 7, the single substrate processing unit 50 also includes a guard 52. The guard 52 has a tubular shape and surrounds the substrate W held by the substrate holding unit 51. The guard 52 receives the liquid scattered from the peripheral edge of the substrate W.

In the example of FIG. 7, the single substrate processing unit 50 also includes a nozzle 53. The nozzle 53 is used to supply, for example, the pure water, or isopropyl alcohol to the substrate W. The nozzle 53 is disposed to be movable between a nozzle processing position and a nozzle standby position by a moving mechanism 54. The nozzle processing position is, for example, a position facing a central portion of the surface of the substrate W in the Z-axis direction, and the nozzle standby position is, for example, a position radially outside the substrate W.

The moving mechanism 54 includes, for example, a mechanism such as the ball screw mechanism or an arm turning mechanism. The pure water, the isopropyl alcohol, or the like is discharged to the substrate W in rotation in a state where the nozzle 53 is located at the nozzle processing position. In this way, the liquid adhering to the surface of the substrate W receives a centrifugal force, spreads over the entire surface of the substrate W, and scatters outward from the peripheral edge of the substrate W.

<Regarding Batch-Single Transfer Unit>

In the example of FIG. 1, the batch-single transfer unit 70 includes a transfer robot 74 and a transfer robot 73.

The transfer robot 74 is disposed to be movable in the X-axis direction. The transfer robot 74 is movable to a position to face a batch processing unit 30c. The transfer robot 74 includes hands 741, and takes out the substrates W in the horizontal form from the transfer robot 66 by moving the hands 741.

The transfer robot 74 may include a plurality of the hands 741. In this case, the transfer robot 74 may take out the plurality of substrates W by the hands 741. In a case where the number of the hands 741 larger than or equal to the number of the substrates W held by the transfer robot 66 is disposed, the transfer robot 74 may take out all the substrates W held by the transfer robot 66.

The transfer robot 73 may directly take out the substrates W from the transfer robot 74, but in the example of FIG. 1, a relay unit 75 is disposed. The relay unit 75 is disposed in the Y-axis negative direction with respect to the transfer robot 74. The relay unit 75 includes a stationary container (not shown) that houses the plurality of substrates W in the horizontal form side by side in the Z-axis direction.

The transfer robot 74 houses the plurality of substrates W in the horizontal form in the container of the relay unit 75.

The transfer robot 73 is disposed in the Y-axis negative direction with respect to the relay unit 75. The transfer robot 73 includes hands 731, and moves the hands 731 to sequentially take out the substrates W from the relay unit 75 and transfer the substrates W to the respective single substrate processing units 50. The transfer robot 73 may include a plurality of hands 731.

The transfer robot 73 is disposed to be movable along the Y-axis direction, and the plurality of single substrate processing units 50 are arranged side by side along the Y-axis direction on both sides of a transfer path.

Further, the transfer robot 73 sequentially takes out the substrates W subjected to the drying processing from the each of the single substrate processing units 50, and sequentially transfers the substrates W to the relay unit 75. In this way, all of the substrates W in the relay unit 75 are eventually replaced with the substrates W subjected to the drying processing.

The transfer robot 74 collectively takes out the plurality of substrates W subjected to the drying processing from the relay unit 75, and transfers the plurality of substrates W to the transfer robot 21 via the relay unit 12. Then, the transfer robot 21 transfers the plurality of substrates W to the carriers C1.

<Regarding Shielding Plate>

FIG. 8 is a diagram schematically showing an example of a configuration of the transfer robot 66 and a periphery thereof. As shown in FIG. 8, a shielding plate 81 may be disposed in the Z-axis positive direction with respect to the transfer robot 66 and in the Z-axis negative direction with respect to a fan filter unit 80. The fan filter unit 80 is disposed in an upper portion of the housing 100, and includes a fan and a filter (for example, a high efficiency particulate air filter (HEPA)) for taking in air in a clean room and sending the air to the single substrate processing units 50 or the like in the housing 100.

The shielding plate 81 is disposed at a position to face the plurality of substrates W held by the transfer robot 66 in the Z-axis direction, and covers the plurality of substrates W held by the transfer robot 66 in plan view. In other words, a contour of the shielding plate 81 in plan view surrounds both the plurality of substrates W immediately before posture changing and the plurality of substrates W immediately after the posture changing.

In this way, since airflow from the fan filter unit 80 is shielded by the shielding plate 81, it is possible to suppress action of the airflow on the plurality of substrates W held by the transfer robot 66. Therefore, since the drying of the substrates W due to the airflow can be suppressed, it is possible to suppress collapse of the three-dimensional structures of the substrates W due to the drying.

The shielding plate 81 may be movable integrally with the transfer robot 66. For example, the shielding plate 81 may be attached to the base 662 of the transfer robot 66 via a fixing member not shown. In this way, since the shielding plate 81 is located immediately above the plurality of substrates W held by the transfer robot 66 regardless of the position of the transfer robot 66, it is possible to reliably suppress contact of the airflow with the plurality of substrates W.

Further, the shielding plate 81 may be immovably fixed to the housing 100 of the substrate processing apparatus 10. In this case, the shielding plate 81 may be disposed over the entire moving region of the transfer robot 66.

Note that in the present embodiment, the transfer robot 66 has a posture changing function. However, the transfer robot

66 may not have the posture changing function, but the transfer robot 74 may have the posture changing function, or a configuration (a posture changing unit) for performing posture changing may be separately disposed. A mechanism for the posture changing in the posture changing unit can be achieved by, for example, a mechanism similar to the holding members 661 in the transfer robot 66.

In a case where the posture changing function is implemented by the posture changing unit, by positioning the shielding plate 81 above the posture changing unit (for example, to be in a lid shape covering an upper side of the posture changing unit), it is possible to reliably suppress the contact of the airflow with the plurality of substrates W as described above.

<Regarding Start Timing of Chemical Liquid Processing>

Hereinafter, a start timing of the chemical liquid processing, will be described, for transferring the substrates W after being subjected to the chemical liquid processing and the rinse processing in the batch processing units 30 to the single substrate processing units 50 while controlling a waiting period of time to perform the drying processing in the single substrate processing units 50.

In a case where the single substrate processing units 50 are in the substrate processing at a timing after the substrate processing is performed in the batch processing units 30 (in a case where the plurality of single substrate processing units 50 are disposed, all of which are in the substrate processing), that is, in a case where there is no free space in the single substrate processing units 50, the substrates W which have completed the substrate processing in the batch processing units 30 are required to wait at a predetermined location.

In the present embodiment, it is assumed that such standby location of the substrates W is in the processing tank 31 of the batch processing unit 30$b$ for the rinse liquid. Since the substrates W are waiting in the processing tank 31 of the batch processing unit 30$b$ for the rinse liquid, the drying of the substrates W during waiting is suppressed. Therefore, it is possible to suppress damage (collapse) of the patterns formed on the surfaces of the substrates W.

Here, a relationship below is established among the substrate processing in the batch processing units 30, the substrate processing in the single substrate processing units 50, and the waiting period of time described above.

[Math. 1]

$$TR + TTL + TSL + CN \times TS = TP + TD \tag{1}$$

Figure 9:
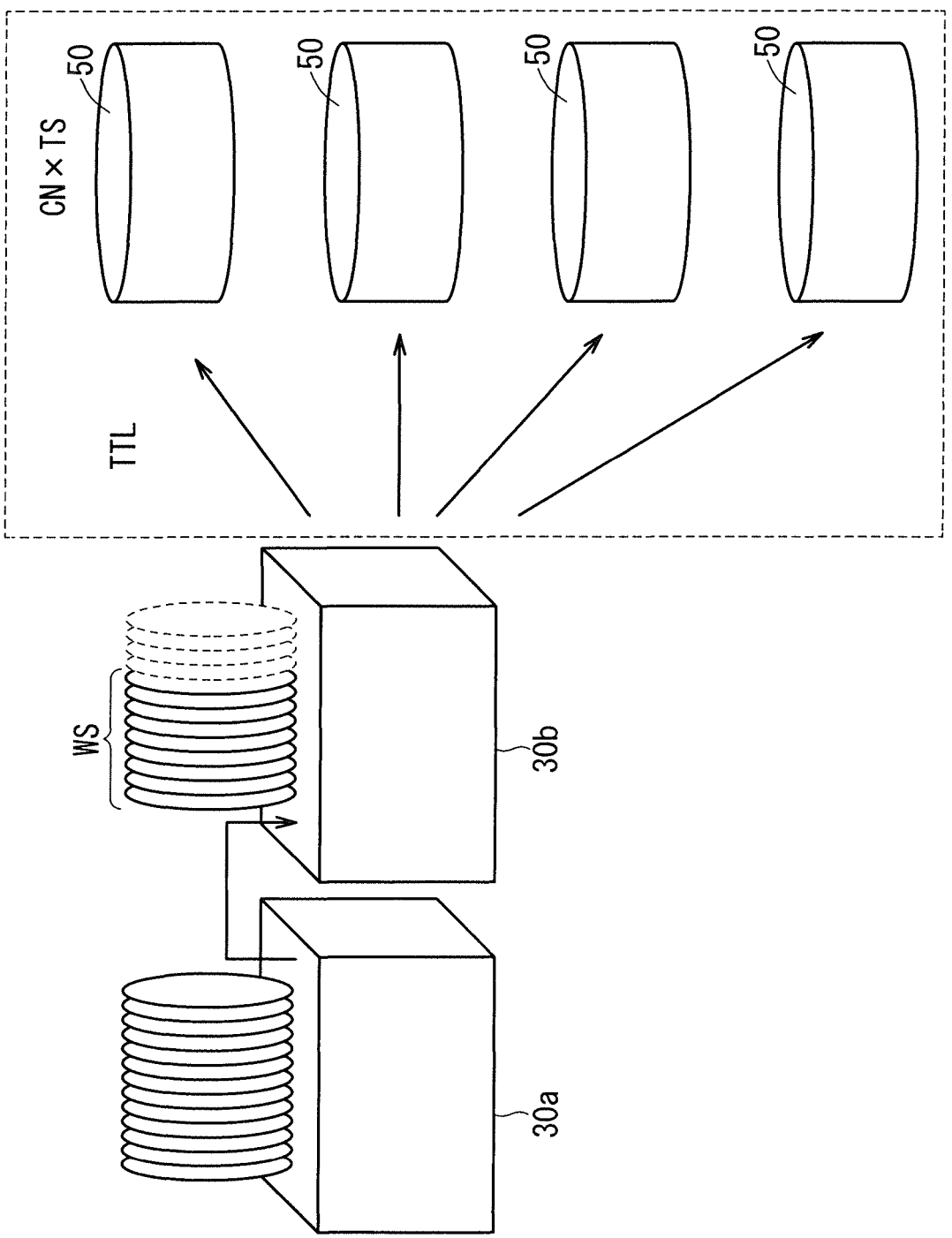
FIG. 9 shows a conceptual diagram schematically showing a relationship of Expression (1).

Here, TR represents a remaining period of time for the rinse processing in the batch processing unit 30$b$, TTL represents a period of time taken for the substrates W to move from a standby location (in the processing tank 31 of the batch processing unit 30$b$ in the present embodiment) to the single substrate processing units 50, TSL represents a longest remaining period of time among the remaining period of time for the substrate processing (the drying processing in the present embodiment) in progress in the plurality of single substrate processing units 50 (in a case where there is one single substrate processing unit 50, a remaining period of time for the substrate processing in progress in the one single substrate processing unit 50), CN represents a rounded integer value (that is, a value obtained by incrementing an integer part by 1 in a case where a decimal point is not 0 and performing rounding with the decimal point being 0) of a value obtained by dividing the number of the substrates W waiting at the standby location by the number of the single substrate processing units 50, TS represents a period of time required for the substrate processing (the drying processing in the present embodiment) in the each of the single substrate processing units 50, TP represents a period of time required for the chemical liquid processing in the batch processing units 30, and TD represents a waiting period of time of the substrates W at the standby location (in the processing tank 31 of the batch processing unit 30b in the present embodiment). Here, the number of the substrates W after being subjected to the chemical liquid processing and before being subjected to the drying processing in the single substrate processing units 50 is defined as the standby number. In the present embodiment, the standby number is the number of the substrates W waiting at the standby location. FIG. 9 shows a conceptual diagram schematically showing the relationship of Expression (1).

Here, a period of time taken for the substrates W waiting at the standby location to complete the substrate processing in the single substrate processing units 50 is defined as a required period of time. In Expression (1) described above, a sum of left sides corresponds to the required period of time.

Further, in Expression (1) described above, the CN corresponds to the number of times of repetition of the substrate processing required until processing of all the substrates W distributed to the single substrate processing units 50 is completed. Further, in the present embodiment, the number of the single substrate processing units 50 is four, but the number of the single substrate processing units 50 may be one or more.

Further, the TTL, which is the period of time taken for the substrates W to move from the standby location to the single substrate processing units 50, also includes a period of time taken for the posture changing of the substrates W to be performed by the transfer robot 66.

With reference to Expression (1) described above, it is possible to calculate the waiting period of time (TD) for the substrates W which have completed the chemical liquid processing in the batch processing units 30 to wait at the standby location. Conversely, if the start timing of the chemical liquid processing in the batch processing units 30 is delayed by larger than or equal to the waiting period of time (TD) calculated with reference to Expression (1) described above, the required period of time (the sum of the left sides) becomes shorter than the period of time (TP) taken for the chemical liquid processing in the batch processing units 30. Therefore, the substrates W for which the chemical liquid processing is started at the timing delayed are smoothly transferred to the single substrate processing units 50 without waiting in the batch processing unit 30b, and subjected to the drying processing in the single substrate processing units 50. In other words, by delaying the start timing of the chemical liquid processing in the batch processing units 30 by larger than or equal to waiting period of time (TD) calculated with reference to Expression (1) described above, it is possible to suppress at least an increase in the number of the substrates W waiting at the standby location.

As described above, by delaying the start timing of the chemical liquid processing in the batch processing units 30 by larger than or equal to the waiting period time (TD) calculated, it is possible to suppress the increase in the number of the substrates W waiting at the standby location and efficiently advance the entire substrate processing to be performed by the batch processing units 30 and the single substrate processing units 50.

<Regarding Number of Substrates W to be Subjected to Chemical Liquid Processing>

Hereinafter, a description will be given of the number of the substrates W to be subjected to the chemical liquid processing for transferring the substrates W after being subjected to the chemical liquid processing and the rinse processing in the batch processing units 30 to the single substrate processing units 50 while controlling the waiting period of time to perform the drying processing in the single substrate processing units 50.

As described above, the relationship as in Expression (1) is established among the substrate processing in the batch processing units 30, the substrate processing in the single substrate processing units 50, and the waiting period of time of the substrates W. However, by controlling the number (a processing number WI) of the substrates W to be subjected to the chemical liquid processing in the batch processing units 30, it is also possible to suppress the increase in the number of the substrates W waiting at the standby location.

Figure 10:
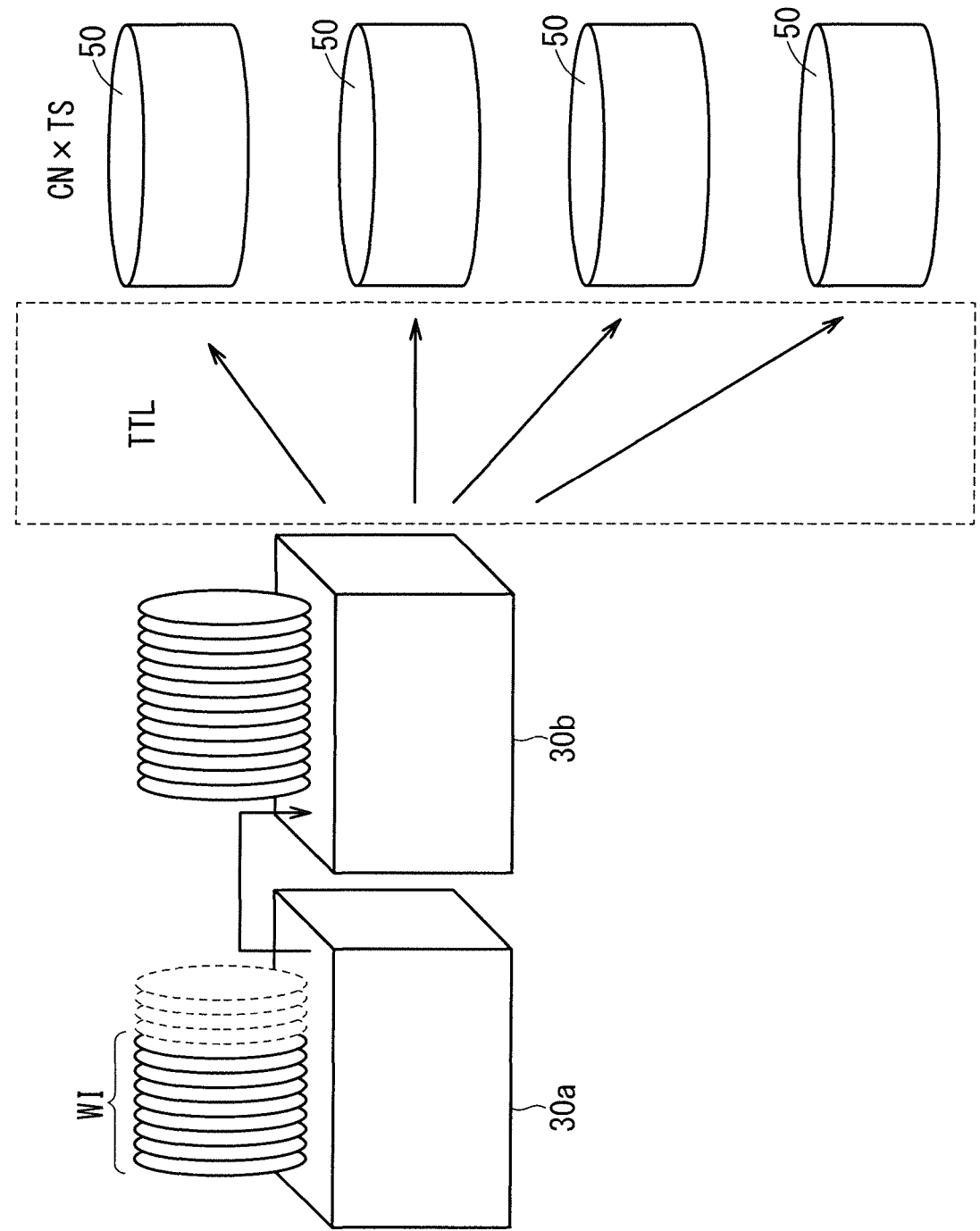
FIG. 10 shows a conceptual diagram schematically showing a relationship of Expression (2).

Here, in a case where the waiting period of time (TD) is set to 0 in Expression (1) and there is no substrate processing in progress in the single substrate processing units 50, Expression (1) will be transformed as follows. FIG. 10 shows a conceptual diagram schematically showing a relationship of Expression (2) below.

[Math. 2]

$$TR + TTL + CN \times TS = TP \qquad (2)$$

Then, calculation of the CN that satisfies Expression (2) described above makes it possible to calculate the processing number WI of the substrates W that can set the waiting period of time (TD) to 0. Here, since the CN is the rounded integer value of the value obtained by dividing the standby number of the substrates W by the number of the single substrate processing units 50, it is possible to calculate an approximate processing number WI of the substrates W by multiplying the calculated CN by the number of the single substrate processing units 50.

By setting the processing number of the substrates W to be subjected to the chemical liquid processing in the batch processing units 30 to be less than or equal to the processing number WI calculated as described above, the required period of time described above becomes shorter than the period of time taken for the chemical liquid processing in the batch processing units 30.

As described above, by performing the chemical liquid processing in the batch processing units 30 on the substrates W in the number of less than or equal to the processing number WI calculated, it is possible to suppress the increase in the number of the substrates W waiting at the standby location to efficiently advance the entire substrate processing to be performed by the batch processing units 30 and the single substrate processing units 50.

Second Embodiment

The substrate processing method according to the present embodiment will be described. Note that in the following description, components similar to the components described in the embodiments described above are denoted by the same reference numerals, and detailed descriptions of the components will be omitted as appropriate.

<Regarding Overall Configuration of Substrate Processing Apparatus>

FIG. 11 shows a plan view schematically showing an example of a configuration of a substrate processing apparatus 10A according to the present embodiment. In FIG. 1, a Z-axis direction is a vertically upward direction. The substrate processing apparatus 10A is an apparatus that performs the wet processing on the substrates W.

As exemplified in FIG. 11, the substrate processing apparatus 10A includes batch processing units 130 that collectively process the plurality of substrates W; the single substrate processing units 50; the inter-batch transfer unit 60; and the batch-single transfer unit 70.

In the example of FIG. 11, a batch processing unit 30a for the chemical liquid and a batch processing unit 30c for standby are disposed as a plurality of the batch processing units 130.

The batch processing unit 30c includes the processing tank 31 and the lifter 32 similarly to the batch processing unit 30a, but the processing tank 31 of the batch processing unit 30c does not store the chemical liquid or stores the processing liquid (for example, the phosphoric acid at a normal temperature) having no reactivity with the substrates W. The plurality of substrates W after being subjected to the chemical liquid processing wait in the batch processing unit 30c until the substrates are transferred to the single substrate processing units 50.

The inter-batch transfer unit 60 receives the plurality of substrates W subjected to the chemical liquid processing from the batch processing unit 30a, and transfers the plurality of substrates W received to the batch processing unit 30c. In the transfer, the plurality of substrates W are transferred in a state where the processing liquid (here, the chemical liquid) adheres to the substrates. Therefore, in the transfer, it is possible to suppress collapse of the three-dimensional structures (for example, the insulating films 91) of the substrates W due to drying.

In the example of FIG. 11, the batch-single transfer unit 70 is disposed in the Y-axis negative direction with respect to the batch processing unit 30c. The batch-single transfer unit 70 receives the plurality of substrates W taken out from the batch processing unit 30c by the inter-batch transfer unit 60, and transfers the substrates W one by one to the single substrate processing units 50.

The single substrate processing units 50 perform the rinse processing and the drying processing on the substrates W. As for the drying processing, since the single substrate processing units 50 dry the substrates W one by one, the substrates W can be dried with a higher drying performance. Therefore, it is possible to suppress the collapse of the three-dimensional structures of the substrates W due to the drying.

<Regarding Start Timing of Chemical Liquid Processing>

Hereinafter, a description will be given of a start timing of the chemical liquid processing for transferring the substrates W after being subjected to the chemical liquid processing in the batch processing units 130 to the single substrate processing units 50 while controlling the waiting period of time to perform the rinse processing and the drying processing in the single substrate processing units 50.

In a case where the single substrate processing units 50 are in the substrate processing at a timing after the substrate processing is performed in the batch processing units 130 (in the case where the plurality of the single substrate processing units 50 are disposed, all of which are in the substrate processing), that is, in the case where there is no free space in the single substrate processing units 50, the substrates W which have completed to the substrate processing in the batch processing units 130 are required to wait at a predetermined location.

In the present embodiment, it is assumed that such standby location of the substrates W is in the processing tank 31 of the batch processing unit 30c for the rinse liquid. In a case where a non-reactive chemical liquid is stored in the processing tank 31 of the batch processing unit 30c in which the substrates W are waiting, since the drying of the substrates W during the waiting is suppressed, it is possible to suppress the damage (the collapse) of the patterns formed on the surfaces of the substrates W.

Here, a relationship below is established among the substrate processing in the batch processing units 130, the substrate processing in the single substrate processing units 50, and the waiting period of time described above.

[Math. 3]

$$TTL + TSL + CN \times TS = TP + TD \qquad (3)$$

Here, TTL represents a period of time taken for the substrates W to move from a standby location (in the processing tank 31 of the batch processing unit 30c in the present embodiment) to the single substrate processing units 50, TSL represents a longest remaining period of time among the remaining period of time for the substrate processing (the rinse processing and the drying processing in the present embodiment) in progress in the plurality of single substrate processing units 50 (the remaining period of time for the substrate processing in progress in the one single substrate processing unit 50 in the case where there is one single substrate processing unit 50), CN represents the rounded integer value (that is, the value obtained by incrementing the integer part by 1 in the case where the decimal point is not 0 and performing rounding with the decimal point being 0) of the value obtained by dividing the number (the standby number) of the substrates W waiting at the standby location by the number of the single substrate processing units 50, TS represents a period of time required for the substrate processing (the rinse processing and the drying processing in the present embodiment) in the each of the single substrate processing units 50, TP represents a period of time required for the chemical liquid processing in the batch processing units 130, and TD represents a waiting period of time of the substrates W at the standby location (in the processing tank 31 of the batch processing unit 30c in the present embodiment). FIG. 12 shows a conceptual diagram schematically showing the relationship of Expression (3).

Here, the required period of time, which is the time taken for the substrates W waiting at the standby location to complete the substrate processing in the single substrate processing units 50, corresponds to sum of left sides in Expression (3) described above.

With reference to Expression (3) described above, it is possible to calculate a waiting period of time (TD) for the substrates W which have completed the chemical liquid processing in the batch processing units 130 to wait at the standby location. Accordingly, if the start timing of the chemical liquid processing in the batch processing units 130 is delayed by larger than or equal to the waiting period of time (TD) calculated with reference to Expression (3) described above, the required period of time (the sum of the left sides) becomes shorter than the period of time (TP)

taken for the chemical liquid processing in the batch processing units 130. Therefore, the substrates W for which the chemical liquid processing is started at the timing delayed are smoothly transferred to the single substrate processing units 50 without waiting in the batch processing unit 30*c*, and subjected to the rinse processing and the drying processing in the single substrate processing units 50.

As described above, as the start timing of the chemical liquid processing in the batch processing units 130 is delayed by larger than or equal to the waiting period of time (TD) calculated, it is possible to suppress the increase in the number of the substrates W waiting at the standby location and efficiently advance the entire substrate processing to be performed by the batch processing units 130 and the single substrate processing units 50.

<Regarding Number of Substrates W to be Subjected to Chemical Liquid Processing>

Hereinafter, a description will be given of the number of the substrates W to be subjected to the chemical liquid processing for transferring the substrates W after being subjected to the chemical liquid processing in the batch processing units 130 to the single substrate processing units 50 while controlling the waiting period of time to perform the rinse processing and the drying processing in the single substrate processing units 50.

As described above, the relationship as in Expression (3) is established among the substrate processing in the batch processing units 130, the substrate processing in the single substrate processing units 50, and the waiting period of time of the substrates W. However, controlling the number (the processing number WI) of the substrates W to be subjected to the chemical liquid processing in the batch processing units 130 also makes it possible to suppress the increase in the number of the substrates W waiting at the standby location.

Figure 13:
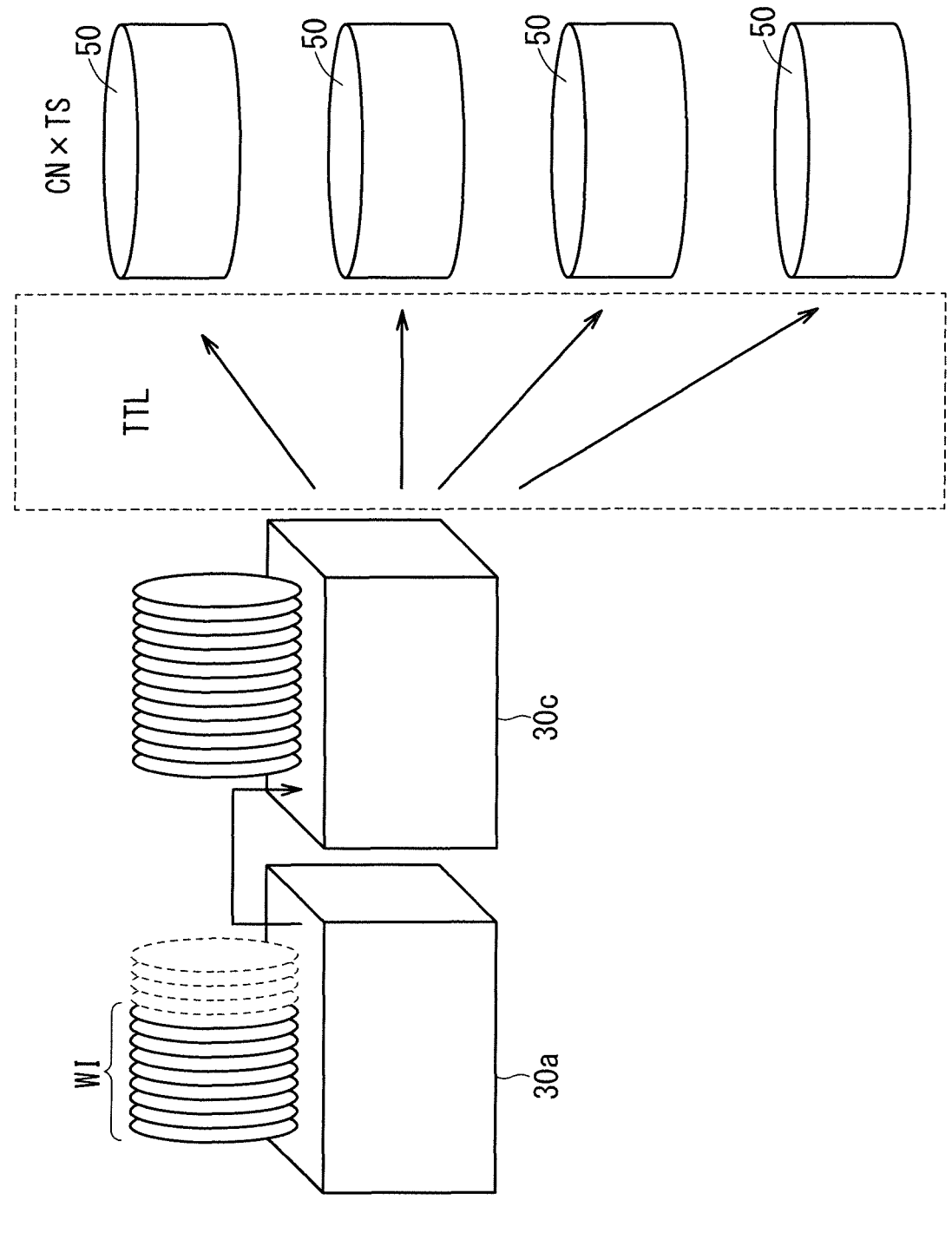
FIG. 13 shows a conceptual diagram schematically showing a relationship of Expression (4).

Here, in a case where the waiting period of time (TD) is set to 0 in Expression (3) and there is no substrate processing in progress in the single substrate processing units 50, Expression (3) will be transformed as follows. FIG. 13 shows a conceptual diagram schematically showing a relationship of Expression (4) below.

[Math. 4]

$$TTL + CN \times TS = TP \qquad (4)$$

Then, calculating the CN that satisfies Expression (4) described above makes it possible to calculate the processing number WI of the substrates W that can set the waiting period of time (TD) to 0.

By setting the processing number of the substrates W to be subjected to the chemical liquid processing in the batch processing units 130 to be less than or equal to the processing number WI calculated as described above, the required period of time described above becomes shorter than the period of time taken for the chemical liquid processing in the batch processing units 130.

As described above, performing the chemical liquid processing in the batch processing units 130 on the substrates W in the number of less than or equal to the processing number WI calculated makes it possible to suppress the increase in the number of the substrates W waiting at the standby location to efficiently advance the entire substrate processing to be performed by the batch processing units 130 and the single substrate processing units 50.

<Regarding Effects Produced by Embodiments Described Above>

Next, examples of the effects produced by the embodiments described above will be described. Note that, in the following description, the effects will be described based on the specific configurations exemplified in the embodiments described above, but the configurations may be replaced with other specific configurations exemplified in the present description as long as similar effects are produced. In other words, for the sake of convenience, only one of the specific configurations associated may be described below as a representative, but the specific configuration described as the representative may be replaced with another specific configuration associated.

Further, such replacement may be performed across a plurality of the embodiments. In other words, the same effects may be produced by combining respective configurations exemplified in different embodiments.

According to the embodiments described above, the substrate processing method includes the following processes, the method performing the substrate processing by using the batch processing units 30 (alternatively, the batch processing units 130) that performs the substrate processing including the chemical liquid processing on the plurality of substrates W and at least one single substrate processing unit 50 that performs the substrate processing including the drying processing on one substrate W. In other words, the method includes: a process of calculating the required period of time that is the period of time taken for the substrates W to complete the substrate processing in the single substrate processing units 50 according to the standby number that is the number of the substrates W after being subjected to the chemical liquid processing in the batch processing units 30 and before being subjected to the drying processing in the single substrate processing units 50; and a process of controlling the start timing of the chemical liquid processing in the batch processing units 30 to make the required period of time shorter than the period of time taken for the chemical liquid processing in the batch processing units 30.

According to such configuration, controlling the start timing of the chemical liquid processing in the batch processing units 30 makes it possible to suppress the increase in the number of the substrates W waiting until the drying processing is performed in the single substrate processing units 50 after the chemical liquid processing is performed in the batch processing units 30. Accordingly, it is not necessary to separately prepare a standby tank or the like for accommodating the substrates W waiting, and it is possible to efficiently advance the entire substrate processing to be performed by the batch processing units 30 and the single substrate processing units 50.

Note that, in a case where there is no particular limitation, an order for each processing to be performed may be changed.

Further, even in a case where other configurations exemplified in the present description are appropriately added to the configuration described above, that is, even in a case where the other configurations not mentioned in the present description as the configuration described above are appropriately added, similar effects can be produced.

Further, according to the embodiments described above, the required period of time includes a remaining period of time for the substrate processing in progress. According to such configuration, since the required period of time can be calculated in consideration of the remaining period of time for the cleaning processing and the drying processing in progress regardless of the start timing of the substrate processing in the single substrate processing units 50, calculation accuracy of the required period of time can be enhanced. Accordingly, it is possible to shorten the waiting period of time of the substrates to be subjected to the substrate processing in the single substrate processing units 50 after the substrate processing in the batch processing units 30.

Further, according to the embodiments described above, the substrate processing method includes the following processes. In other words, the method includes: a process of calculating the required period of time that is the period of time taken for the substrates W to complete the substrate processing in the single substrate processing units 50 according to the standby number that is the number of the substrates W after being subjected to the chemical liquid processing in the batch processing units 30 and before being subjected to the drying processing in the single substrate processing units 50; and a process of changing the processing number of the substrates W in the batch processing units 30 to make the required period of time shorter than the period of time taken for the chemical liquid processing in the batch processing units 30.

According to such configuration, changing the processing number of the substrates in the batch processing units makes it possible to suppress the increase in the number of the substrates waiting until the drying processing is performed in the single substrate processing unit after the chemical liquid processing is performed in the batch processing units. Accordingly, it is not necessary to separately prepare a standby tank or the like for accommodating the substrates W waiting, and it is possible to efficiently advance the entire substrate processing to be performed by the batch processing units 30 and the single substrate processing units 50.

Further, according to the embodiments described above, the substrate processing method includes a process of immersing the plurality of substrates W after being subjected to the chemical liquid processing in the cleaning tank to perform the cleaning processing in the batch processing units 30. Here, the cleaning tank corresponds to, for example, the processing tank 31 in the batch processing unit 30b. Then, the process of calculating the required period of time is a process of calculating the required period of time including the time taken for the cleaning processing according to the standby number of the substrates W immersed in the processing tank 31 in the batch processing unit 30b. According to such configuration, since the substrates W after being subjected to the chemical liquid processing are waiting for the processing in the single substrate processing units 50 in the processing tanks 31 in which the rinse liquid is stored, it is possible to suppress the collapse of the patterns formed on the surfaces of the substrates W due to the drying of the substrates W. Further, since the rinse processing is collectively performed on the plurality of substrates W in the batch processing units 30, the period of time taken for the rinse processing is shortened, also shortening the period of time for the entire substrate processing.

Further, according to the embodiments described above, the substrate processing method includes a process of performing the cleaning processing on the substrates W before being subjected to the drying processing in the single substrate processing units 50. According to such configuration, since the rinse processing is performed in the single substrate processing units 50, the rinse processing can be performed with a high degree of freedom in accordance with properties of the substrates W and a suppressed consumption amount of the rinse liquid.

Further, according to the embodiments described above, the process of calculating the required period of time is a process of calculating the required period of time including the period of time taken for the cleaning processing according to the standby number of the substrates W before moving from the batch processing units 130 to the single substrate processing units 50. According to such configuration, it is possible to efficiently advance the entire substrate processing to be performed by the batch processing units 30 and the single substrate processing units 50.

Further, according to the embodiments described above, the chemical liquid processing in the batch processing units 30 is performed by immersing the substrates W in the chemical liquid tank. Here, the chemical liquid tank corresponds to, for example, the processing tank 31 or the like in the batch processing unit 30a. Then, the substrate processing method includes a process of immersing the plurality of substrates W after being subjected to the chemical liquid processing in the processing tank 31 in the batch processing unit 30b to perform the cleaning processing in the batch processing units 30. Here, the processing tank 31 in the batch processing unit 30a includes a first region in which the chemical liquid processing is started at a first start timing, and a second region in which the chemical liquid processing is started at a second start timing different from the first start timing, and the processing tank 31 in the batch processing unit 30b includes a third region in which the cleaning processing is performed on the substrates W subjected to the chemical liquid processing in the first region, and a fourth region in which the cleaning processing is performed on the substrates W subjected to the chemical liquid processing in the second region. According to such configuration, by advancing the substrate processing at different timings in a plurality of the regions in one processing tank 31, the processing number of the substrates W or a degree of freedom with respect to content of the substrate processing is increased. Further, since the number of the substrates W for which the substrate processing is simultaneously completed in the batch processing units 30 is reduced, a maximum processing number of the substrates W required in the single substrate processing units 50 is reduced. As a result, it is possible to effectively shorten the waiting period of time of the substrate W to be subjected to the substrate processing in the single substrate processing units 50 after the substrate processing in the batch processing units 30.

Further, according to the embodiments described above, the required period of time includes a period of time taken for the substrates W to move from the batch processing units 30 to the single substrate processing units 50. According to such configuration, it is possible to efficiently advance the entire substrate processing to be performed by the batch processing units 30 and the single substrate processing units 50 also in consideration of the period of time for moving the substrates W from the batch processing units 30 to the single substrate processing units 50.

Further, according to the embodiments described above, the required period of time includes a period of time taken for the posture changing for the substrates W subjected to the substrate processing in the batch processing units 30 to be subjected to the substrate processing in the single substrate processing units 50. According to such configuration, it is possible to efficiently advance the entire substrate processing to be performed in the batch processing units 30 and the single substrate processing units 50 also in consideration of a period of time for the posture changing from the upright form (a vertical form) suitable for batch processing to the horizontal form suitable for single substrate processing.

Further, according to the embodiments described above, the required period of time includes a period of time taken for the substrate processing repeatedly performed in one single substrate processing unit 50 in a case where the standby number of the substrates W are distributed to the plurality of single substrate processing units 50. According to such configuration, it is possible to efficiently advance the entire substrate processing to be performed in the batch processing units 30 and the single substrate processing units 50 also in consideration of the number of times of the repetition of the substrate processing required until the substrates W waiting are distributed to the single substrate processing units 50 and the processing on all the substrates W is completed.

Modifications of Embodiments Described Above

In the embodiments described above, for example, a texture, a material, a dimension, a shape, a relative arrangement relationship, or implementation conditions of each of the components may also be described, but are exemplary in all aspects and are not restrictive.

Therefore, innumerable modifications and equivalents not exemplified are assumed within the scope of the technique disclosed in the present description. For example, the scope includes a case where at least one component is modified, added, or omitted, and a case where at least one component in at least one embodiment is extracted and combined with a component in another embodiment.

Further, in the embodiments described above, in a case where a material name or the like is described without being particularly specified, the material includes other additives, for example, an alloy, unless there is a contradiction.

EXPLANATION OF REFERENCE SIGNS

10, 10A: substrate processing apparatus
11: load port
12, 75: relay units
20: indexer transfer unit
21, 65, 66, 73, 74: transfer robots
30, 30a, 30b, 30c, 130: batch processing units
31: processing tank
32: lifter
33, 611, 661: holding members
34, 662: bases
35: lifting mechanism
50: single substrate processing unit
51: substrate holding unit
52: guard
53: nozzle
54, 665: moving mechanisms
60: inter-batch transfer unit
70: batch-single transfer unit
80: fan filter unit
81: shielding plate
90: laminated structure
91: insulating film
92: sacrificial film
93: support layer
94: trench
100: housing
211, 731, 741: hands
212: upright support member

511: stage
512: chuck pin
513, 664: rotating mechanisms
514: shaft
515: motor
613, 663: switching mechanisms
6611: contact member
6612: support member
6613: rotating member

The invention claimed is:

1. A substrate processing method for performing substrate processing by using a batch processing unit that performs said substrate processing including chemical liquid processing on a plurality of substrates, and at least one single substrate processing unit that performs said substrate processing including drying processing on one of said substrates, the method comprising:

a process of calculating a required period of time that is a period of time taken for said substrates to complete said substrate processing in said at least one single substrate processing unit according to a standby number that is a number of said substrates after being subjected to said chemical liquid processing in said batch processing unit and before being subjected to said drying processing in said at least one single substrate processing unit; and a process of controlling a start timing of said chemical liquid processing in said batch processing unit to make said required period of time shorter than a period of time taken for said chemical liquid processing in said batch processing unit.

2. The substrate processing method according to claim 1, wherein said required period of time includes a remaining period of time for said substrate processing in progress.

3. The substrate processing method according to claim 1, the method further comprising a process of performing cleaning processing by immersing said plurality of substrates in a cleaning tank after being subjected to said chemical liquid processing in said batch processing unit, wherein said process of calculating said required period of time is a process of calculating said required period of time including a period of time taken for said cleaning processing according to said standby number of said substrates immersed in said cleaning tank.

4. The substrate processing method according to claim 1, the method further comprising a process of performing cleaning processing on said substrates before being subjected to said drying processing in said at least one single substrate processing unit.

5. The substrate processing method according to claim 4, wherein said process of calculating said required period of time is a process of calculating said required period of time including a period of time taken for said cleaning processing according to said standby number of said substrates before moving from said batch processing unit to said at least one single substrate processing unit.

6. The substrate processing method according to claim 1, wherein said chemical liquid processing is performed in said batch processing unit by immersing said substrates in a chemical liquid tank, the method further comprising a process of performing cleaning processing by immersing said plurality of substrates after being subjected to said chemical liquid processing in a cleaning tank in said batch processing unit, wherein said chemical liquid tank includes a first region in which said chemical liquid processing is started at a first start timing, and a second region in which said chemical liquid processing is started at a second start timing that is a timing different from said first start timing, and said cleaning tank includes a third region in which said cleaning processing is performed on said substrates subjected to said chemical liquid processing in said first region, and a fourth region in which said cleaning processing is performed on said substrates subjected to said chemical liquid processing in said second region.

7. The substrate processing method according to claim 1, wherein said required period of time includes a period of time taken for said substrates to move from said batch processing unit to said at least one single substrate processing unit.

8. The substrate processing method according to claim 1, wherein said required period of time includes a period of time taken for posture changing for said substrates subjected to said substrate processing in said batch processing unit to be subjected to said substrate processing in said at least one single substrate processing unit.

9. The substrate processing method according to claim 1, wherein in a case where said standby number of said substrates are distributed to a plurality of single substrate processing units, said required period of time includes a period of time taken for said substrate processing to be repeatedly performed in one of said plurality of single substrate processing units.

10. A substrate processing method for performing substrate processing by using a batch processing unit that performs said substrate processing including chemical liquid processing on a plurality of substrates, and at least one single substrate processing unit that performs said substrate processing including drying processing on one of said substrates, the method comprising:

a process of calculating a required period of time that is a period of time taken for said substrates to complete said substrate processing in said at least one single substrate processing unit according to a standby number that is a number of said substrates after being subjected to said chemical liquid processing in said batch processing unit and before being subjected to said drying processing in said at least one single substrate processing unit; and a process of changing a processing number of said substrates in said batch processing unit to make said required period of time shorter than a period of time taken for said chemical liquid processing in said batch processing unit.

11. The substrate processing method according to claim 3, the method further comprising a process of performing cleaning processing by immersing said plurality of substrates in a cleaning tank after being subjected to said chemical liquid processing in said batch processing unit, wherein said process of calculating said required period of time is a process of calculating said required period of time including a period of time taken for said cleaning processing according to said standby number of said substrates immersed in said cleaning tank.

12. The substrate processing method according to claim 3, the method further comprising a process of performing cleaning processing on said substrates before being subjected to said drying processing in said at least one single substrate processing unit.

13. The substrate processing method according to claim 12, wherein said process of calculating said required period of time is a process of calculating said required period of time including a period of time taken for said cleaning processing according to said standby number of said substrates before moving from said batch processing unit to said at least one single substrate processing unit.

14. The substrate processing method according to claim 10, wherein said chemical liquid processing is performed in said batch processing unit by immersing said substrates in a chemical liquid tank, the method further comprising a process of performing cleaning processing by immersing said plurality of substrates after being subjected to said chemical liquid processing in a cleaning tank in said batch processing unit, wherein said chemical liquid tank includes a first region in which said chemical liquid processing is started at a first start timing, and a second region in which said chemical liquid processing is started at a second start timing that is a timing different from said first start timing, and said cleaning tank includes a third region in which said cleaning processing is performed on said substrates subjected to said chemical liquid processing in said first region, and a fourth region in which said cleaning processing is performed on said substrates subjected to said chemical liquid processing in said second region.

15. The substrate processing method according to claim 3, wherein said required period of time includes a period of time taken for said substrates to move from said batch processing unit to said at least one single substrate processing unit.

16. The substrate processing method according to claim 3, wherein said required period of time includes a period of time taken for posture changing for said substrates subjected to said substrate processing in said batch processing unit to be subjected to said substrate processing in said at least one single substrate processing unit.

17. The substrate processing method according to claim 3, wherein in a case where said standby number of said substrates are distributed to a plurality of single substrate processing units, said required period of time includes a period of time taken for said substrate processing to be repeatedly performed in one of said at least one single substrate processing units.

* * * * *